US012615825B2

(12) United States Patent
Park et al.

(10) Patent No.: US 12,615,825 B2
(45) Date of Patent: Apr. 28, 2026

(54) THREE-DIMENSIONAL SEMICONDUCTOR DEVICES

(71) Applicant: Samsung Electronics Co., Ltd., Suwon-si (KR)

(72) Inventors: Sungil Park, Suwon-si (KR); Kyuman Hwang, Seoul (KR); Jae Hyun Park, Hwaseong-si (KR); Doyoung Choi, Hwaseong-si (KR); Daewon Ha, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 947 days.

(21) Appl. No.: 17/838,384

(22) Filed: Jun. 13, 2022

(65) Prior Publication Data

US 2023/0146060 A1 May 11, 2023

(30) Foreign Application Priority Data

Nov. 9, 2021 (KR) ........................ 10-2021-0152930

(51) Int. Cl.
    *H10D 64/01* (2025.01)
    *H10B 41/27* (2023.01)
    (Continued)

(52) U.S. Cl.
    CPC ........... *H10D 64/017* (2025.01); *H10B 41/27* (2023.02); *H10B 43/10* (2023.02); *H10B 43/27* (2023.02);
    (Continued)

(58) Field of Classification Search
    CPC ............. H10D 64/017; H10D 84/0177; H10D 84/038; H10D 88/00; H10D 88/01; H10D 30/014; H10D 30/43; H10D 30/6735; H10D 30/6757; H10D 64/691; H10D 62/822; H10D 64/667; H10D 64/685; H10D 62/121; H10D 62/151; H10D 64/251; H10D 84/85; H10D 84/0167; H10D 84/0181;
(Continued)

(56) References Cited

U.S. PATENT DOCUMENTS

| 10,748,994 B2 | 8/2020 | Reznicek et al. |
| 10,784,171 B2 | 9/2020 | Frougier et al. |

(Continued)

*Primary Examiner* — Fernando L Toledo
*Assistant Examiner* — Jorge Andres Lopez
(74) *Attorney, Agent, or Firm* — Wolf, Greenfield & Sacks, P.C.

(57) ABSTRACT

Three-dimensional (3D) semiconductor device may include a first active region on a substrate, the first active region including a lower channel pattern and a pair of lower source/drain patterns that are on opposing side surfaces of the lower channel pattern respectively, a second active region stacked on the first active region, the second active region including an upper channel pattern and a pair of upper source/drain patterns that are on opposing side surfaces of the upper channel pattern, respectively, a dummy channel pattern between the lower and upper channel patterns, a pair of liner layers that are on opposing side surfaces of the dummy channel pattern, respectively, and a gate electrode on the lower, dummy, and upper channel patterns. The gate electrode may include a lower gate electrode on the lower channel pattern and an upper gate electrode on the upper channel pattern.

10 Claims, 41 Drawing Sheets

(51) Int. Cl.

| | |
|---|---|
| *H10B 43/10* | (2023.01) |
| *H10B 43/27* | (2023.01) |
| *H10D 84/01* | (2025.01) |
| *H10D 84/03* | (2025.01) |
| *H10D 88/00* | (2025.01) |

(52) U.S. Cl.
CPC ....... *H10D 84/0177* (2025.01); *H10D 84/038* (2025.01); *H10D 88/00* (2025.01); *H10D 88/01* (2025.01)

(58) Field of Classification Search
CPC ........... H10D 84/0186; H10D 84/0188; H10D 84/853; H10D 30/6215; H10D 64/68; H10B 41/27; H10B 43/10; H10B 43/27; B82Y 10/00; H01L 21/28185
See application file for complete search history.

(56) References Cited

U.S. PATENT DOCUMENTS

| | | | |
|---|---|---|---|
| 10,833,078 B2 | 11/2020 | Smith et al. | |
| 2019/0318967 A1* | 10/2019 | Chen | H10D 62/235 |
| 2019/0393307 A1* | 12/2019 | Reznicek | H01L 21/02532 |
| 2020/0098859 A1 | 3/2020 | Reboh et al. | |
| 2020/0294866 A1 | 9/2020 | Cheng et al. | |
| 2020/0365464 A1 | 11/2020 | Sreenivasan et al. | |
| 2021/0175327 A1 | 6/2021 | Fulford et al. | |
| 2021/0184000 A1 | 6/2021 | Ramaswamy et al. | |
| 2021/0202500 A1 | 7/2021 | Chanemougame et al. | |
| 2021/0265345 A1* | 8/2021 | Xie | H10D 62/116 |

* cited by examiner

THREE-DIMENSIONAL SEMICONDUCTOR DEVICES

CROSS-REFERENCE TO RELATED APPLICATION

This U.S. non-provisional patent application claims priority under 35 U.S.C. § 119 to Korean Patent Application No. 10-2021-0152930, filed on Nov. 9, 2021, in the Korean Intellectual Property Office, the entire contents of which are hereby incorporated by reference.

BACKGROUND OF THE INVENTION

The present disclosure relates to a three-dimensional semiconductor device and a method of fabricating the same, and in particular, to a three-dimensional semiconductor device including a field effect transistor and a method of fabricating the same.

A semiconductor device includes an integrated circuit (e.g., metal-oxide-semiconductor field-effect transistors (MOS-FETs)). To meet an increasing demand for a semiconductor device with a small pattern size and a reduced design rule, the MOS-FETs are being aggressively scaled down. The scale-down of the MOS-FETs may lead to deterioration in operational properties of the semiconductor device. A variety of studies are being conducted to overcome technical limitations associated with the scale-down of the semiconductor device and to realize the semiconductor devices with high performance.

SUMMARY

Some embodiments of the inventive concept provide three-dimensional semiconductor devices with improved reliability.

Some embodiments of the inventive concept provide methods of fabricating a three-dimensional semiconductor device with improved reliability.

According to some embodiments of the inventive concept, a three-dimensional (3D) semiconductor device may include a first active region on a substrate, the first active region including a lower channel pattern and a pair of lower source/drain patterns, respectively on side surfaces of the lower channel pattern, a second active region on (e.g., stacked on) the first active region, the second active region including an upper channel pattern and a pair of upper source/drain patterns, respectively on opposing side surfaces of the upper channel pattern, a dummy channel pattern between the lower channel pattern and the upper channel pattern, a pair of liner layers, respectively on opposing side surfaces of the dummy channel pattern, and a gate electrode on the lower channel pattern, the dummy channel pattern, and the upper channel pattern. The gate electrode may include a lower gate electrode on the lower channel pattern and an upper gate electrode on the upper channel pattern.

According to some embodiments of the inventive concept, a three-dimensional (3D) semiconductor device include a first active region on a substrate, the first active region including a lower channel pattern and a lower source/drain pattern connected to (e.g., electrically connected) the lower channel pattern, a second active region on (e.g., stacked on) the first active region, the second active region including an upper channel pattern and an upper source/drain pattern connected to (e.g., electrically connected) the upper channel pattern, a dummy channel pattern between the lower channel pattern and the upper channel pattern, and a gate electrode on the lower channel pattern, the dummy channel pattern, and the upper channel pattern. The gate electrode may include a first portion between the lower channel pattern and the dummy channel pattern and a second portion between the dummy channel pattern and the upper channel pattern. The first portion may include a first metal pattern including a first work function metal and a second metal pattern including a second work function metal, and the second portion may include a third metal pattern including the first work function metal. A thickness of the third metal pattern (e.g., a thickness in a vertical direction) may be different from a thickness of the first metal pattern (e.g., a thickness in the vertical direction).

According to some embodiments of the inventive concept, a three-dimensional (3D) semiconductor device include a lower channel pattern on a substrate, the lower channel pattern including a first semiconductor pattern and a second semiconductor pattern, which are stacked to be spaced apart from each other, an upper channel pattern on the lower channel pattern, the upper channel pattern including a third semiconductor pattern and a fourth semiconductor pattern, which are stacked to be spaced apart from each other, a dummy channel pattern between the second semiconductor pattern and the third semiconductor pattern, and a gate electrode in which the first, second, third and fourth semiconductor patterns and the dummy channel pattern are provided. In some embodiments, the gate electrode may enclose the first to fourth semiconductor patterns and the dummy channel pattern. The first to fourth semiconductor patterns and the dummy channel pattern may be vertically overlapped with each other. A thickness of the dummy channel pattern in a vertical direction may be larger than respective thicknesses of the first to fourth semiconductor patterns in the vertical direction.

BRIEF DESCRIPTION OF DRAWINGS

FIGS. 4A to 4D are sectional views, which are respectively taken along lines A-A', B-B', C-C', and D-D' of FIG. 3.

FIGS. 5 to 7 are enlarged sectional views, each of which illustrates a portion 'M' of FIG. 4A, according to embodiments of the inventive concept.

FIGS. 8A, 8B, 9A, 9B, 10A, 10B, 11A, 11B, 12A, 12B, 13A, 13B, 14A, 14B, 15A, 15B, 16A, 16B, 17A and 17B are sectional views illustrating a method of fabricating a semiconductor device, according to an embodiment of the inventive concept.

DETAILED DESCRIPTION

Figure 1:
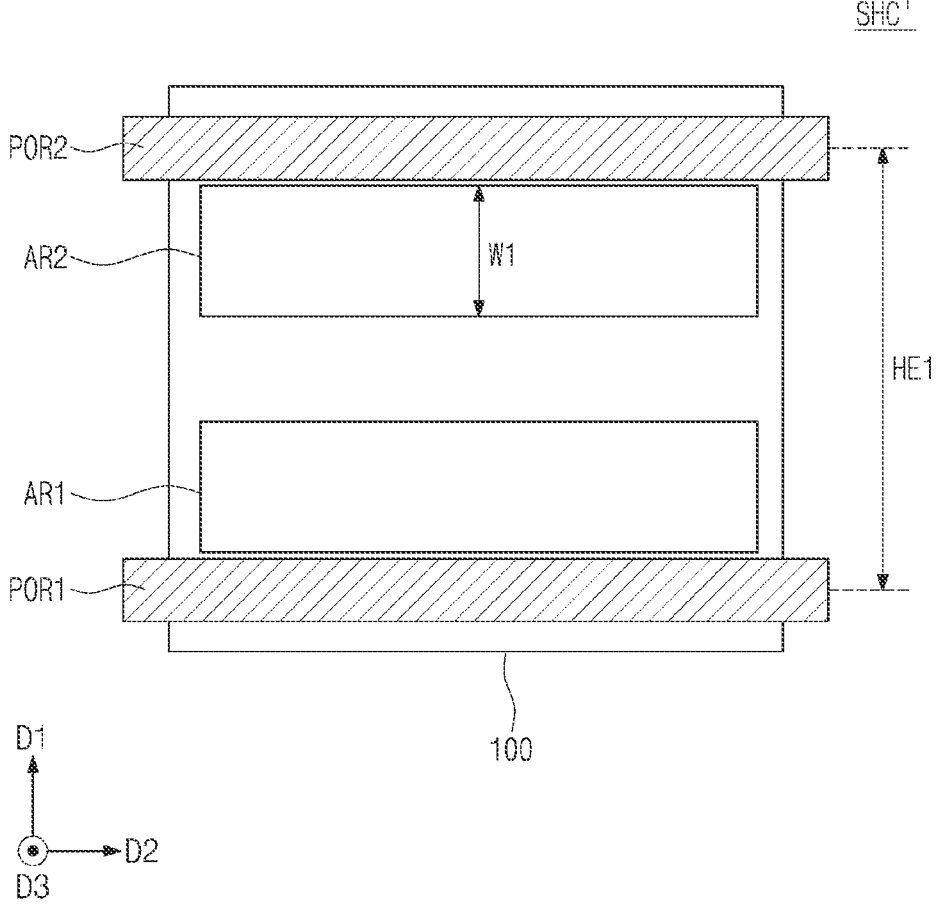
FIG. 1 is a conceptual diagram illustrating a logic cell of a semiconductor device according to a comparative example.

FIG. 1 is a conceptual diagram illustrating a logic cell of a semiconductor device according to a comparative example. In detail, FIG. 1 illustrates a logic cell of a two-dimensional device according to the comparative example.

Referring to FIG. 1, a single height cell SHC' may be provided. In detail, a first power line POR1 and a second power line POR2 may be provided on a substrate 100. A drain voltage VDD (i.e., a power voltage) may be applied to one of the first and second power lines POR1 and POR2. A source voltage VSS (i.e., a ground voltage) may be applied to the other of the first and second power lines POR1 and POR2. In an embodiment, the source voltage VSS may be applied to the first power line POR1, and the drain voltage VDD may be applied to the second power line POR2.

The single height cell SHC' may be defined between the first power line POR1 and the second power line POR2. The single height cell SHC' may include a first active region AR1 and a second active region AR2. One of the first and second active regions AR1 and AR2 may be a PMOSFET region, and the other of the first and second active regions AR1 and AR2 may be an NMOSFET region. As an example, the first active region AR1 may be the NMOSFET region, and the second active region AR2 may be the PMOSFET region. In other words, the single height cell SHC' may have a CMOS structure provided between the first power line POR1 and the second power line POR2.

The semiconductor device according to the comparative example may be a two-dimensional device, in which transistors of a front-end-of-line (FEOL) layer are two-dimensionally arranged. For example, NMOSFETs of the first active region AR1 and PMOSFETs of the second active region AR2 may be formed to be spaced apart from each other in a first direction D1.

Each of the first and second active regions AR1 and AR2 may have a first width W1 in the first direction D1. In the comparative example, a length of the single height cell SHC' in the first direction D1 may be defined as a first height HE1. The first height HE1 may be substantially equal to a distance (e.g., pitch) between the first and second power lines POR1 and POR2 (e.g., a distance between centers of the first and second power lines POR1 and POR2).

The single height cell SHC' may constitute a single logic cell. In the present specification, the logic cell may mean a logic device (e.g., AND, OR, XOR, XNOR, inverter, and so forth), which is configured to execute a specific function. For example, the logic cell may include transistors constituting the logic device and interconnection lines connecting the transistors to each other.

Since the single height cell SHC' according to the comparative example includes a two-dimensional device, the first active region AR1 and the second active region AR2 may not be overlapped with each other but may be arranged to be spaced apart from each other in the first direction D1. Thus, the first height HE1 should be defined in such a way that both of the first and second active regions AR1 and AR2, which are spaced apart from each other in the first direction D1, are included in the single height cell SHC'. As a result, the first height HE1 of the single height cell SHC' according to the comparative example should be a relatively large value. In other words, the single height cell SHC' according to the comparative example may have a relatively large area.

Figure 2:
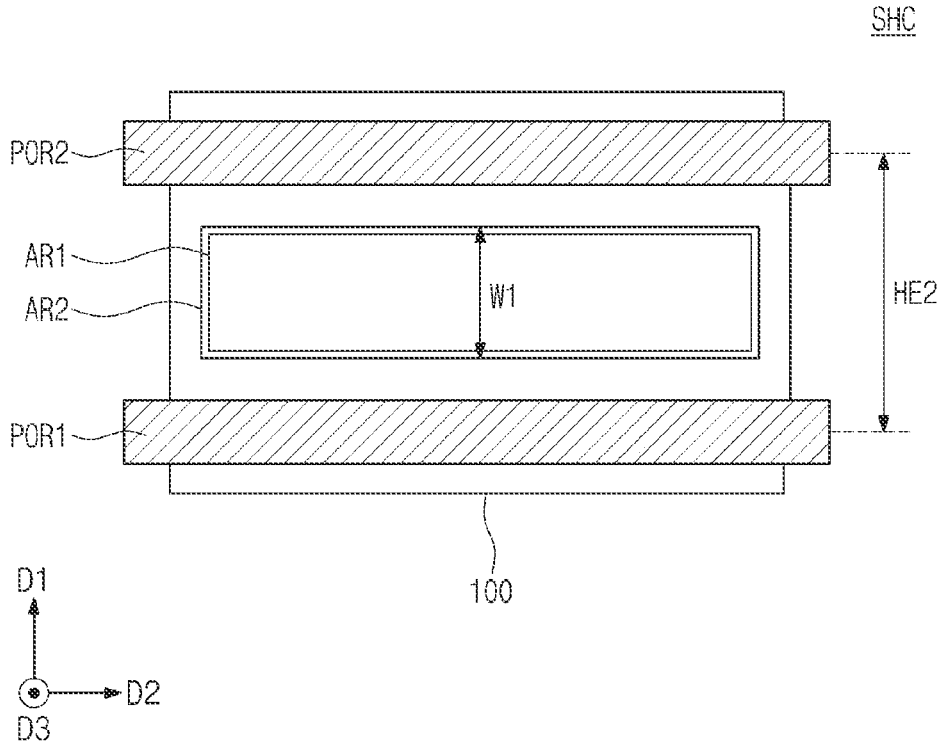
FIG. 2 is a conceptual diagram illustrating a logic cell of a semiconductor device according to an embodiment of the inventive concept.

FIG. 2 is a conceptual diagram illustrating a logic cell of a semiconductor device according to an embodiment of the inventive concept. FIG. 2 illustrates a logic cell of a three-dimensional device according to an embodiment of the inventive concept.

Referring to FIG. 2, a single height cell SHC including a three-dimensional device (e.g., stacked transistors) may be provided. In detail, a first power line POR1 and a second power line POR2 may be provided on a substrate 100. The single height cell SHC may be defined between the first power line POR1 and the second power line POR2.

The single height cell SHC may include first and second active regions AR1 and AR2. One of the first and second active regions AR1 and AR2 may be a PMOSFET region, and the other of the first and second active regions AR1 and AR2 may be an NMOSFET region.

The semiconductor device according to the present embodiment may be a three-dimensional device, in which transistors of an FEOL layer are vertically stacked. The first active region AR1 as a bottom tier may be provided on the substrate 100, and the second active region AR2 as a top tier may be stacked on the first active region AR1. For example, NMOSFETs of the first active region AR1 may be provided on the substrate 100, and PMOSFETs of the second active region AR2 may be stacked on the NMOSFETs. The first active region AR1 and the second active region AR2 may be spaced apart from each other in a vertical direction (i.e., a third direction D3).

Each of the first and second active regions AR1 and AR2 may have a first width W1 in a first direction D1. In the present embodiment, a length of the single height cell SHC in the first direction D1 may be defined as a second height HE2.

Since the single height cell SHC according to the present embodiment includes the three-dimensional device (i.e., the stacked transistors), the first active region AR1 may be overlapped with the second active region AR2. Thus, the second height HE2 of the single height cell SHC may be designed to be slightly larger than a width of a single active region (i.e., the first width W1). As a result, the second height HE2 of the single height cell SHC according to the present embodiment may be smaller than the first height HE1 of the single height cell SHC' described with reference to FIG. 1. In other words, the single height cell SHC according to the present embodiment may have a relatively small area. In the three-dimensional semiconductor device according to the present embodiment, it may be possible to reduce an area for the logic cell and thereby to increase an integration density of the semiconductor device.

Figure 3:
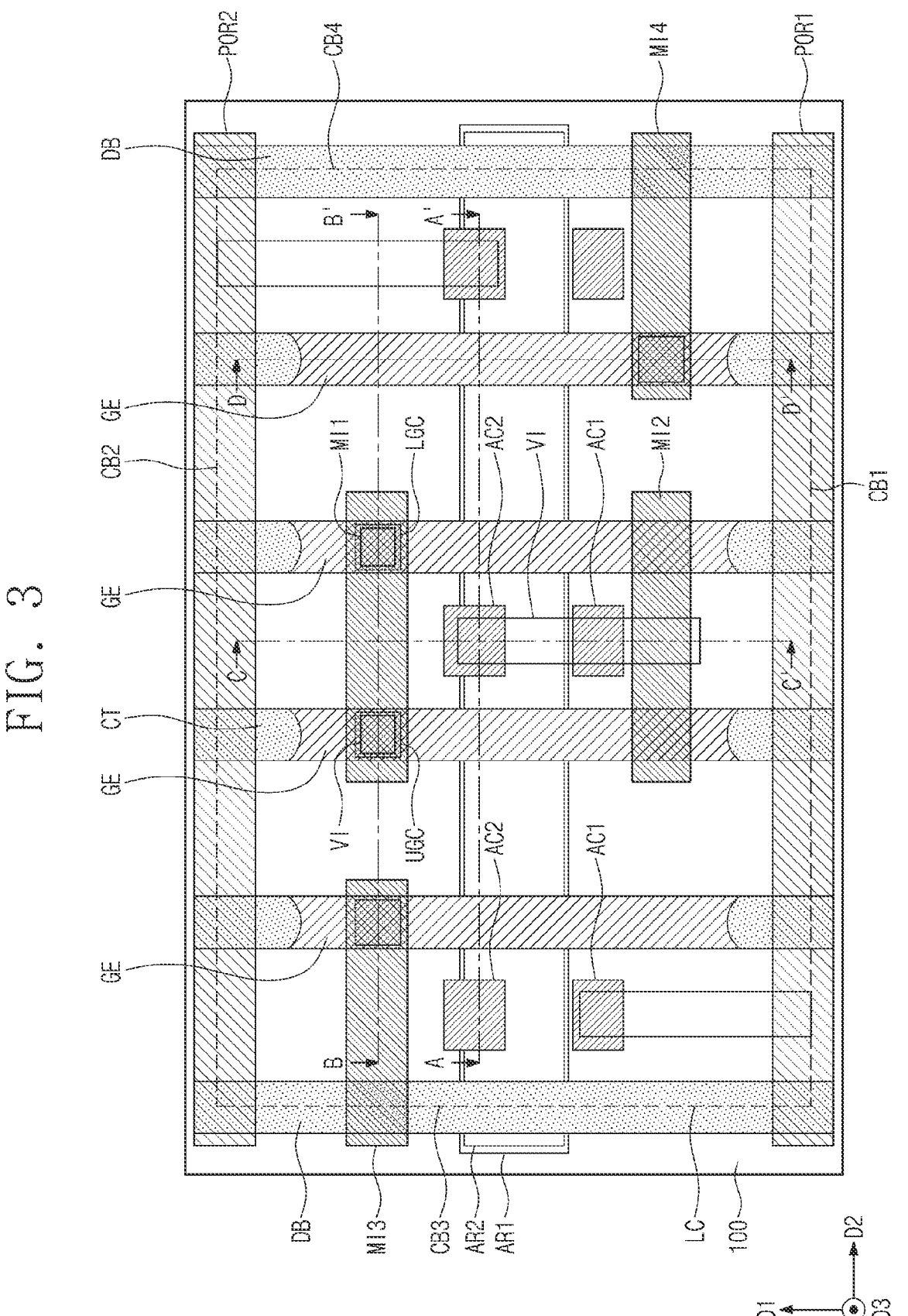
FIG. 3 is a plan view illustrating a three-dimensional semiconductor device according to an embodiment of the inventive concept.

FIG. 3 is a plan view illustrating a three-dimensional semiconductor device according to an embodiment of the inventive concept. FIGS. 4A to 4D are sectional views, which are respectively taken along lines A-A', B-B', C-C', and D-D' of FIG. 3. The three-dimensional semiconductor device illustrated in FIGS. 3 and 4A to 4D is provided as an example of the single height cell SHC of FIG. 2, and the inventive concept is not limited to this example.

Referring to FIGS. 3 and 4A to 4D, a logic cell LC may be provided on the substrate 100. The substrate 100 may be a semiconductor substrate, which is formed of or include silicon, germanium, silicon germanium, or compound semiconductor materials. In an embodiment, the substrate 100 may be a silicon wafer.

The logic cell LC may include the first and second active regions AR1 and AR2 sequentially stacked on the substrate 100. One of the first and second active regions AR1 and AR2 may be a PMOSFET region, and the other of the first and second active regions AR1 and AR2 may be an NMOSFET region. The first active region AR1 may be provided as a bottom tier of the FEOL layer, and the second active region AR2 may be provided as a top tier of the FEOL layer. The NMOS- and PMOS-FETs of the first and second active regions AR1 and AR2 may be vertically stacked to form a three-dimensional stack transistor (3DS FET). In the present embodiment, the first active region AR1 may be an NMOS-FET region, and the second active region AR2 may be a PMOSFET region. When viewed in a plan view, the first and second active regions AR1 and AR2 stacked may be located between the first power line POR1 and the second power line POR2.

An active pattern AP may be defined by a trench TR, which is formed in an upper portion of the substrate 100. The active pattern AP may be a vertically-protruding portion of the substrate 100. When viewed in a plan view, the active pattern AP may have a bar shape extending in a second direction D2. The first and second active regions AR1 and AR2 may be sequentially stacked on the active pattern AP.

A device isolation layer ST may be provided to fill the trench TR. The device isolation layer ST may include a silicon oxide layer. A top surface of the device isolation layer ST may be coplanar with or lower than a top surface of the active pattern AP. The device isolation layer ST may not cover lower and upper channel patterns CH1 and CH2, which will be described below. As used herein, a bottom surface of an element may refer to a surface facing the substrate 100, and a top surface may be opposite the bottom surface.

The first active region AR1, which includes lower channel patterns CH1 and lower source/drain patterns SD1, may be provided on the active pattern AP. Each of the lower channel patterns CH1 may be interposed between a pair of the lower source/drain patterns SD1. The lower channel pattern CH1 may connect the pair of the lower source/drain patterns SD1 to each other.

The lower channel pattern CH1 may include a first semiconductor pattern SP1 and a second semiconductor pattern SP2, which are sequentially stacked. The first and second semiconductor patterns SP1 and SP2 may be spaced apart from each other in a vertical direction (i.e., the third direction D3). Each of the first and second semiconductor patterns SP1 and SP2 may be formed of or include at least one of silicon (Si), germanium (Ge), or silicon germanium (SiGe). In an embodiment, each of the first and second semiconductor patterns SP1 and SP2 may be formed of or include crystalline silicon.

The lower source/drain patterns SD1 may be provided on the top surface of the active pattern AP. Each of the lower source/drain patterns SD1 may be an epitaxial pattern, which is formed by a selective epitaxial growth (SEG) process. As an example, a top surface of the lower source/drain pattern SD1 may be higher than a top surface of the second semiconductor pattern SP2 of the lower channel pattern CH1.

The lower source/drain patterns SD1 may be doped to have a first conductivity type. The first conductivity type may be a p- or n-type. In the present embodiment, the first conductivity type may be an n-type. The lower source/drain patterns SD1 may be formed of or include silicon (Si) and/or silicon germanium (SiGe).

A first interlayer insulating layer 110 may be provided on the lower source/drain patterns SD1. The first interlayer insulating layer 110 may cover the lower source/drain patterns SD1. A second interlayer insulating layer 120 and the second active region AR2 may be provided on the first interlayer insulating layer 110.

The second active region AR2 may include upper channel patterns CH2 and upper source/drain patterns SD2. The upper channel patterns CH2 may be vertically overlapped with the lower channel patterns CH1, respectively. The upper source/drain patterns SD2 may be vertically overlapped with the lower source/drain patterns SD1, respectively. Each of the upper channel patterns CH2 may be interposed between a pair of the upper source/drain patterns SD2. The upper channel pattern CH2 may connect the pair of the upper source/drain patterns SD2 to each other.

The upper channel pattern CH2 may include a third semiconductor pattern SP3 and a fourth semiconductor pattern SP4, which are sequentially stacked. The third and fourth semiconductor patterns SP3 and SP4 may be spaced apart from each other in the third direction D3. The third and fourth semiconductor patterns SP3 and SP4 of the upper channel pattern CH2 may be formed of or include the same semiconductor materials as the first and second semiconductor patterns SP1 and SP2 of the lower channel pattern CH1 described above.

Figure 4A:
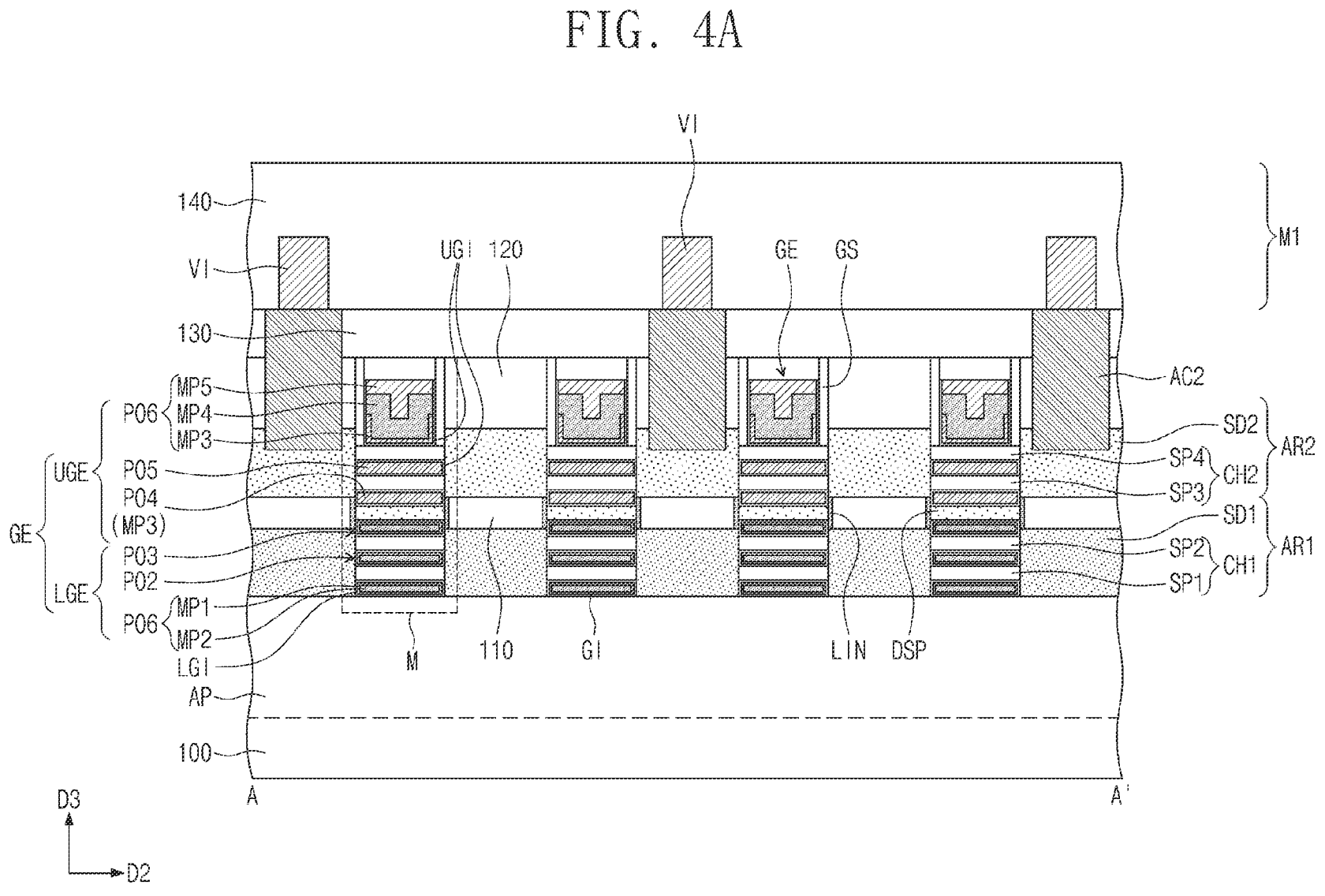
Figure 4B:
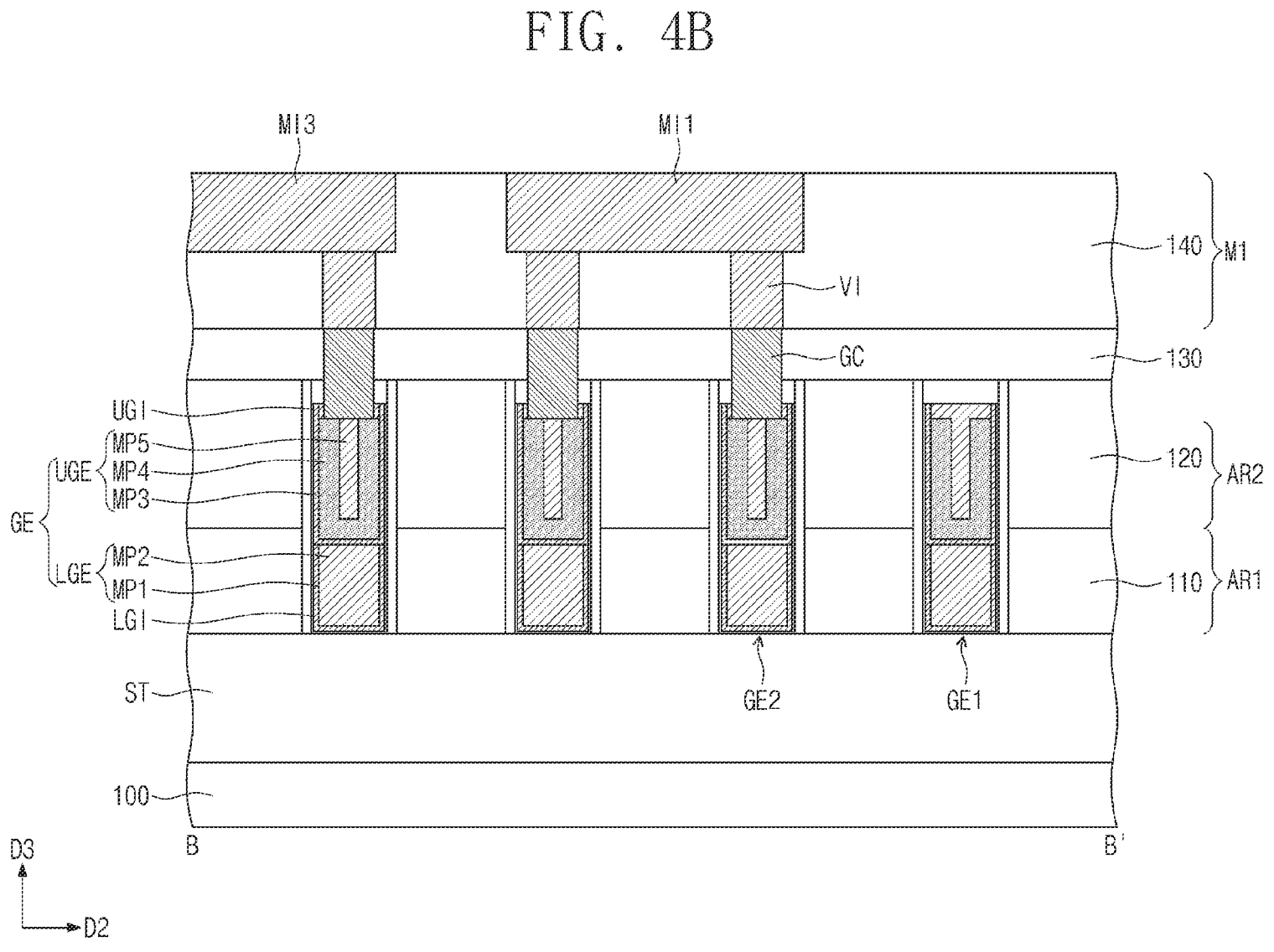

At least one dummy channel pattern DSP may be interposed between the lower channel pattern CH1 and the upper channel pattern CH2 thereon. The dummy channel pattern DSP may be spaced apart from the lower source/drain patterns SD1. The dummy channel pattern DSP may be spaced apart from the upper source/drain patterns SD2. In other words, the dummy channel pattern DSP may not be connected to (e.g., electrically connected to) any source/drain pattern. The dummy channel pattern DSP may be formed of or include at least one of semiconductor materials (e.g., silicon (Si), germanium (Ge), or silicon germanium (SiGe)) or silicon-based insulating materials (e.g., silicon oxide or silicon nitride). In an embodiment, the dummy channel pattern DSP may be formed of or include at least one of the silicon-based insulating materials. As used herein, a silicon-based insulating material may refer to an insulating material including silicon. In some embodiments, the dummy channel pattern DSP and the lower and upper channel patterns CH1 and CH2 may have an equal width (e.g., an equal width in the first direction D1 or the second direction D2), and side surfaces of the dummy channel pattern DSP and the lower and upper channel patterns CH1 and CH2 may be coplanar with each other as illustrated in FIG. 4A.

The upper source/drain patterns SD2 may be provided on a top surface of the first interlayer insulating layer 110. Each of the upper source/drain patterns SD2 may be an epitaxial pattern, which is formed by a selective epitaxial growth (SEG) process. In an embodiment, a top surface of the upper source/drain pattern SD2 may be higher than a top surface of the fourth semiconductor pattern SP4 of the upper channel pattern CH2.

The upper source/drain patterns SD2 may be doped to have a second conductivity type. The second conductivity type may be different from the first conductivity type of the lower source/drain pattern SD1. For example, the second conductivity type may be a p-type. The upper source/drain patterns SD2 may be formed of or include silicon germanium (SiGe) and/or silicon (Si).

The second interlayer insulating layer 120 may cover the upper source/drain patterns SD2. A top surface of the second interlayer insulating layer 120 may be coplanar with a top surface of each of first and second active contacts AC1 and AC2, which will be described below.

A gate electrode GE may be provided on the lower and upper channel patterns CH1 and CH2, which are sequentially stacked. When viewed in a plan view, the gate electrode GE may have a bar shape extending in the first direction D1. In an embodiment, a plurality of gate electrodes GE may be provided on the substrate 100. The gate electrodes GE may be arranged in the second direction D2 with a first pitch. Each of the gate electrodes GE may be vertically overlapped with the lower and upper channel patterns CH1 and CH2 which are stacked.

The gate electrode GE may be extended from the top surface of the device isolation layer ST (or the top surface of the active pattern AP) to a gate capping pattern GP in a vertical direction (i.e., the third direction D3). The gate electrode GE may be extended from the lower channel pattern CH1 of the first active region AR1 to the upper channel pattern CH2 of the second active region AR2 in the third direction D3. The gate electrode GE may be extended from the lowermost one of the first semiconductor patterns SP1 to the uppermost one of the fourth semiconductor patterns SP4 in the third direction D3.

The gate electrode GE may be provided on a top surface, a bottom surface, and opposite side surfaces of each of the first to fourth semiconductor patterns SP1 to SP4. That is, the transistor according to the present embodiment may include a three-dimensional field effect transistor (e.g., MBCFET or GAAFET) in which the gate electrode GE is provided to three-dimensionally surround the channel pattern.

The gate electrode GE may include a lower gate electrode LGE, which is provided in the bottom tier (i.e., the first active region AR1) of the FEOL layer, and an upper gate electrode UGE, which is provided in the top tier (i.e., the second active region AR2) of the FEOL layer. The lower gate electrode LGE and the upper gate electrode UGE may be vertically overlapped with each other. The lower gate electrode LGE and the upper gate electrode UGE may be connected to each other. In other words, the gate electrode GE according to the present embodiment may be a common gate electrode, which is realized by connecting the lower gate electrode LGE on the lower channel pattern CH1 to the upper gate electrode UGE on the upper channel pattern CH2.

The lower gate electrode LGE may include a first portion PO1 interposed between the active pattern AP and the first semiconductor pattern SP1, a second portion PO2 interposed between the first semiconductor pattern SP1 and the second semiconductor pattern SP2, and a third portion PO3 interposed between the second semiconductor pattern SP2 and the dummy channel pattern DSP. A top surface of the lower gate electrode LGE may be located at a level between a top surface and a bottom surface of the dummy channel pattern DSP.

The upper gate electrode UGE may include a fourth portion PO4 interposed between the dummy channel pattern DSP and the third semiconductor pattern SP3, a fifth portion PO5 interposed between the third semiconductor pattern SP3 and the fourth semiconductor pattern SP4, and a sixth portion PO6 on the fourth semiconductor pattern SP4. A bottom surface of the upper gate electrode UGE may be in direct contact with the top surface of the lower gate electrode LGE.

A pair of gate spacers GS may be respectively disposed on opposite side surfaces of the gate electrode GE. Referring to FIG. 4A, a pair of the gate spacers GS may be respectively disposed on opposite side surfaces of the sixth portion PO6. The gate spacers GS may be extended along the gate electrode GE and in the first direction D1. Top surfaces of the gate spacers GS may be higher than a top surface of the gate electrode GE. The top surfaces of the gate spacers GS may be coplanar with the top surface of the second interlayer insulating layer 120. The gate spacers GS may be formed of or include at least one of SiCN, SiCON, or SiN. As another example, the gate spacers GS may include a multi-layer containing at least two of SiCN, SiCON, or SiN. A pair of liner layers LIN may be respectively provided on opposite side surfaces of each of the third and fourth portions PO3 and PO4 of the gate electrode GE.

The gate capping pattern GP may be provided on the top surface of the gate electrode GE. The gate capping pattern GP may be extended along the gate electrode GE and in the first direction D1. For example, the gate capping pattern GP may be formed of or include at least one of SiON, SiCN, SiCON, or SiN.

A gate insulating layer UGI or LGI may be interposed between the gate electrode GE and the first to fourth semiconductor patterns SP1 to SP4. More specifically, a lower gate insulating layer LGI may be interposed between the lower gate electrode LGE and the first and second semiconductor patterns SP1 and SP2. An upper gate insulating layer UGI may be interposed between the upper gate electrode UGE and the third and fourth semiconductor patterns SP3 and SP4.

Each of the lower and upper gate insulating layers UGI and LGI may include a silicon oxide layer, a silicon oxynitride layer, and/or a high-k dielectric layer. In an embodiment, each of the lower and upper gate insulating layers UGI and LGI may include a silicon oxide layer, which is provided to directly cover a surface of at least one of the first to fourth semiconductor pattern SP1 to SP4, and a high-k dielectric layer, which is provided on the silicon oxide layer. In other words, each of the lower and upper gate insulating layers UGI and LGI may have a multi-layered structure.

The high-k dielectric layer may be formed of or include at least one of high-k dielectric materials whose dielectric constants are higher than that of silicon oxide. For example, the high-k dielectric material may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

In an embodiment, the lower gate insulating layer LGI may include a first dipole element. The first dipole element may include lanthanum (La), aluminum (Al), or a combination thereof. That is, the lower gate insulating layer LGI may contain at least one of lanthanum (La) or aluminum (Al) as an impurity. The lower gate insulating layer LGI may include a dipole-interface, which is formed between the high-k dielectric layer and the silicon oxide layer by the dipole element.

As an example, in the case where the lower gate insulating layer LGI contains lanthanum (La), an effective work function of the lower gate electrode LGE may be lowered. As a result, a threshold voltage of an NMOS transistor in the first active region AR1 may be lowered. As another example, in the case where the lower gate insulating layer LGI contains aluminum (Al), the effective work function of the lower gate electrode LGE may be increased. As a result, the threshold voltage of the NMOS transistor in the first active region AR1 may be increased.

In an embodiment, the upper gate insulating layer UGI may not include the dipole element. For example, the highest concentration of the dipole element in the upper gate insulating layer UGI may be lower than the highest concentration of the dipole element in the lower gate insulating layer LGI.

In another embodiment, the upper gate insulating layer UGI may include a second dipole element. The second dipole element may be the same as or different from the first dipole element. The highest concentration of the second dipole element in the upper gate insulating layer UGI may be equal to or different from the highest concentration of the first dipole element in the lower gate insulating layer LGI.

The lower gate electrode LGE may include a first metal pattern MP1 on the first and second semiconductor patterns SP1 and SP2 and a second metal pattern MP2 on the first metal pattern MP1. The first metal pattern MP1 may include a first work function metal, and the second metal pattern MP2 may include a second work function metal. By adjusting compositions of the first and second work function metals, the transistor of the first active region AR1 may be formed to have a desired threshold voltage.

The first work function metal of the first metal pattern MP1 may be a p-type work function metal having a relatively high work function. The first metal pattern MP1 may be formed of or include at least one of metal nitrides. The first metal pattern MP1 may include at least one metallic element, which is selected from the group consisting of titanium (Ti), tantalum (Ta), aluminum (Al), tungsten (W), and molybdenum (Mo), and nitrogen (N). For example, the first metal pattern MP1 may be formed of or include at least one of titanium nitride (TiN), tantalum nitride (TaN), titanium oxynitride (TiON), titanium silicon nitride (TiSiN), titanium aluminum nitride (TiAlN), tungsten carbon nitride (WCN), or molybdenum nitride (MoN).

The second work function metal of the second metal pattern MP2 may be an n-type work function metal having a relatively low work function. The second metal pattern MP2 may be formed of or include at least one of metal carbides. The second metal pattern MP2 may be formed of or include at least one of metal carbides that are doped with silicon and/or aluminum and contain silicon and/or aluminum. As an example, the second metal pattern MP2 may be formed of or include aluminum-doped titanium carbide (TiAlC), aluminum-doped tantalum carbide (TaAlC), aluminum-doped vanadium carbide (VAlC), silicon-doped titanium carbide (TiSiC), or silicon-doped tantalum carbide (TaSiC). As another example, the second metal pattern MP2 may be formed of or include titanium carbide (TiAlSiC), which is doped with aluminum and silicon, or tantalum carbide (TaAlSiC), which is doped with aluminum and silicon. As other example, the second metal pattern MP2 may be formed of or include aluminum-doped titanium (TiAl). As still other example, the second metal pattern MP2 may be formed of or include a metal nitride doped with silicon and/or aluminum (e.g., aluminum-doped titanium nitride (TiAlN)).

A work function of the second metal pattern MP2 may be controlled by adjusting a doping concentration of dopants or impurities (e.g., silicon or aluminum) contained in the second metal pattern MP2. As an example, the concentration of the impurity (e.g., silicon or aluminum) in the second metal pattern MP2 may range from 0.1 at % to 25 at %.

Each of the first, second and third portions PO1, PO2, and PO3 of the lower gate electrode LGE may be composed of the second metal pattern MP2 and the first metal pattern MP1 enclosing the second metal pattern MP2. In an embodiment, a thickness of the second metal pattern MP2 may be larger than a thickness of the first metal pattern MP1.

Figure 4C:
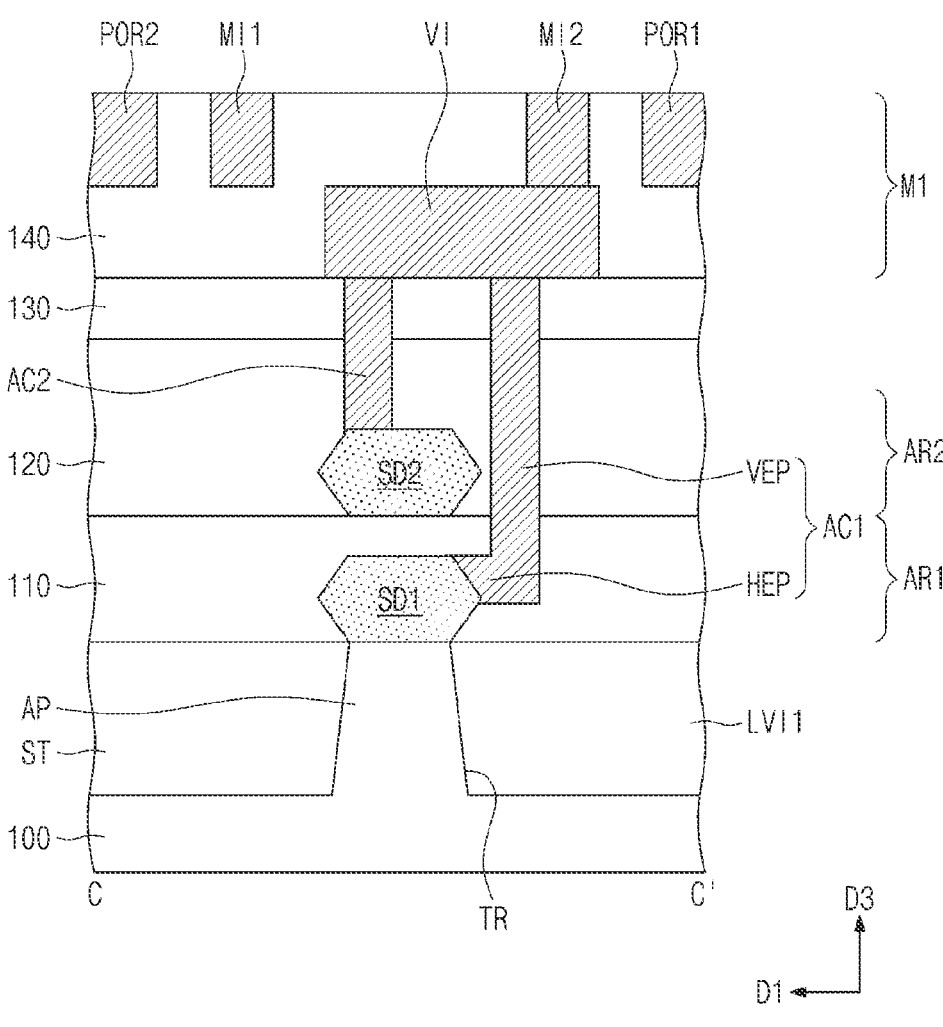
Figure 4D:
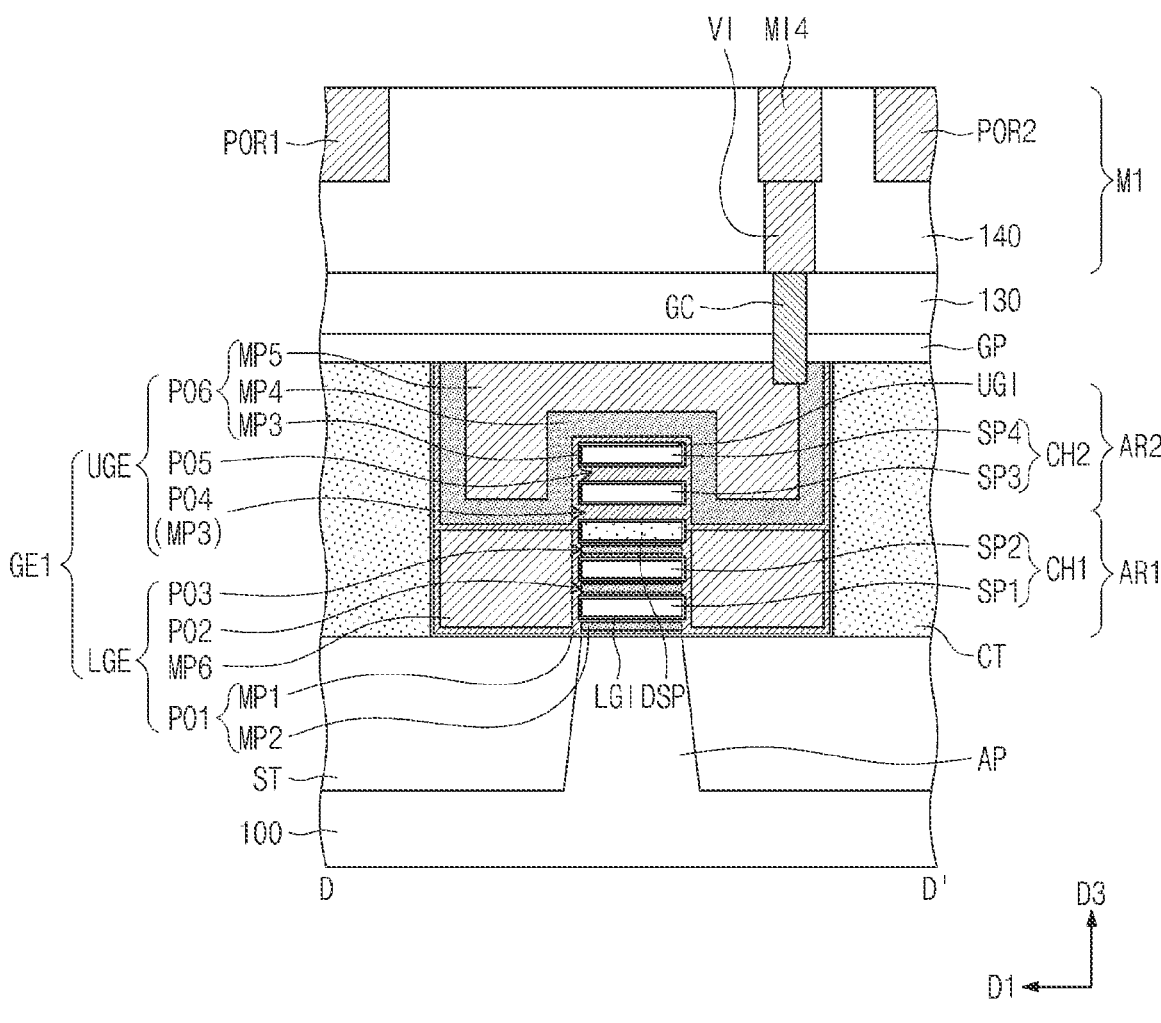

The lower gate electrode LGE may further include a sixth metal pattern MP6, which is provided as a remaining portion of the lower gate electrode LGE, in addition to the first, second and third portions PO1, PO2, and PO3 and the first and second metal patterns MP1 and MP2 (e.g., see FIG. 4D). The sixth metal pattern MP6 may have a lower resistance than the first and second metal patterns MP1 and MP2. As an example, the sixth metal pattern MP6 may be formed of or include at least one of low resistance metallic materials (e.g., tungsten (W), ruthenium (Ru), aluminum (Al), titanium (Ti), and tantalum (Ta)).

Referring to FIG. 4D, a top surface of the sixth metal pattern MP6 of the gate electrode GE may be in contact with a bottom surface of the upper gate electrode UGE. The top surface of the sixth metal pattern MP6 may be located at a level between the top and bottom surfaces of the dummy channel pattern DSP.

The upper gate electrode UGE of the gate electrode GE may include a third metal pattern MP3 on the third and fourth semiconductor patterns SP3 and SP4. The third metal pattern MP3 may be provided to enclose the third and fourth semiconductor patterns SP3 and SP4. The upper gate electrode UGE may further include a fourth metal pattern MP4 and a fifth metal pattern MP5 on the third metal pattern MP3.

The third metal pattern MP3 may include the first work function metal, and the fourth metal pattern MP4 may include the second work function metal. By adjusting compositions of the first and second work function metals, the transistor of the second active region AR2 may be formed to have a desired threshold voltage.

The first work function metal of the third metal pattern MP3 may be a p-type work function metal having a relatively high work function, similar to the first metal pattern MP1 described above. The third metal pattern MP3 may be formed of or include at least one of metal nitrides. The third metal pattern MP3 may be formed of or include a metal nitride, which is the same as or different from that in the first metal pattern MP1. A thickness, in the third direction D3, of the third metal pattern MP3 in the fourth and fifth portions PO4 and PO5 may be larger than a thickness, in the third direction D3, of the first metal pattern MP1 in the first to third portions PO1, PO2, and PO3.

The second work function metal of the fourth metal pattern MP4 may be a n-type work function metal having a relatively low work function, similar to the second metal pattern MP2 described above. The fourth metal pattern MP4 may be formed of or include at least one of metal carbides that are doped with silicon and/or aluminum and contain silicon and/or aluminum. The fourth metal pattern MP4 may be formed of or include a material, which is the same as or different from the second metal pattern MP2. A thickness of the fourth metal pattern MP4 may be different from a thickness of the second metal pattern MP2. For example, the thickness of the fourth metal pattern MP4 may be larger than the thickness of the second metal pattern MP2.

The fourth and fifth portions PO4 and PO5 of the upper gate electrode UGE may be composed of the third metal pattern MP3. The sixth portion PO6 of the upper gate electrode UGE may include the third metal pattern MP3, the fourth metal pattern MP4, and the fifth metal pattern MP5, which are sequentially stacked.

In an embodiment, the fifth metal pattern MP5 may include the first work function metal. For example, the fifth metal pattern MP5 may be formed of or include the same metal nitride material as the third metal pattern MP3. In another embodiment, the fifth metal pattern MP5 may be formed of or include at least one of low resistance metallic materials. For example, the fifth metal pattern MP5 may be formed of or include the same metallic material as the sixth metal pattern MP6.

Referring back to FIG. 3, the logic cell LC according to the present embodiment may include a first cell boundary CB1, which is defined to extend in the second direction D2. A second cell boundary CB2, which is extended in the second direction D2, may be defined at an opposite side of the first cell boundary CB1. Gate cutting patterns CT may be disposed on the first and second cell boundaries CB1 and CB2. When viewed in a plan view, the gate cutting patterns CT may be arranged with the first pitch along the first cell boundary CB1. The gate cutting patterns CT may be arranged with the first pitch along the second cell boundary CB2. When viewed in a plan view, the gate cutting patterns CT on the first and second cell boundaries CB1 and CB2 may be disposed to be overlapped with gate electrodes GE, respectively.

The gate cutting pattern CT may be provided to penetrate the gate electrode GE1 or GE2. The gate electrode GE1 or GE2 may be separated from another gate electrode, which is adjacent thereto in the first direction D1, by the gate cutting pattern CT. For example, referring to FIG. 4D, a pair of the gate cutting patterns CT may be respectively provided at opposite end portions of the gate electrode GE. The gate cutting patterns CT may be formed of or include at least one of insulating materials (e.g., silicon oxide, silicon nitride, or combinations thereof).

In the present embodiment, a third cell boundary CB3, which is extended in the first direction D1, may be defined in the logic cell LC. A fourth cell boundary CB4, which is extended in the first direction D1, may be defined at an opposite side of the third cell boundary CB3. Cell division structures DB may be disposed on the third and fourth cell boundaries CB3 and CB4, respectively. The cell division structures DB may be extended in the first direction D1 to separate the logic cell LC of FIG. 3 from another logic cell adjacent thereto.

A gate contact GC may be provided to penetrate a third interlayer insulating layer 130 and the gate capping pattern GP and to be electrically connected to the gate electrode GE. In detail, the gate contact GC may be coupled to (e.g., may contact) the upper gate electrode UGE of the gate electrode GE. The gate contact GC may have a pillar shape extending in the third direction D3. The gate contact GC may be formed of or include at least one of metallic materials (e.g., copper (Cu), aluminum (Al), ruthenium (Ru), cobalt (Co), tungsten (W), and molybdenum (Mo)).

A first active contact AC1 may be provided on at least one of the lower source/drain patterns SD1 (e.g., see FIG. 4C). The first active contact AC1 may include a vertical extended portion VEP and a horizontal extended portion HEP. The vertical extended portion VEP may be provided to penetrate the first to third interlayer insulating layers 110, 120, and 130 and may have a vertically-extending pillar shape. The vertical extended portion VEP of the first active contact AC1 may be horizontally offset from the lower and upper source/drain patterns SD1 and SD2 which are stacked. The horizontal extended portion HEP may be provided in the bottom tier of the FEOL layer. The horizontal extended portion HEP may be extended from the vertical extended portion VEP in the first direction D1 and may be coupled to (e.g., may contact) the lower source/drain pattern SD1.

The horizontal extended portion HEP and the vertical extended portion VEP may be connected to each other to form each of the first active contacts AC1. The first active contact AC1 may be formed of or include at least one of doped semiconductor materials and/or metallic materials. In an embodiment, the metallic materials may include copper (Cu), aluminum (Al), ruthenium (Ru), cobalt (Co), tungsten (W), and molybdenum (Mo).

The second active contact AC2 may be provided on at least one of the upper source/drain patterns SD2 (e.g., see FIG. 4C). The second active contact AC2 may be disposed spaced apart from the first active contact AC1 in the first direction D1. The second active contact AC2 may be vertically overlapped with the upper source/drain pattern SD2. As used herein, "an element A vertically overlapping an element B" (or similar language) means that at least one vertical line intersecting both the elements A and B exists.

The second active contact AC2 may be provided in the top tier of the FEOL layer. The second active contact AC2 may have a vertically-extending pillar shape. The second active contact AC2 may be directly coupled to the upper source/drain pattern SD2. In an embodiment, the second active contact AC2 may be formed of or include the same material as the first active contact AC1.

A fourth interlayer insulating layer 140 may be provided on the third interlayer insulating layer 130. A first metal layer M1 may be provided in the fourth interlayer insulating layer 140. The first metal layer M1 may include the first power line POR1, the second power line POR2, and first to fourth interconnection lines MI1 to MI4.

When viewed in a plan view, the first power line POR1 may be provided on the first cell boundary CB1, and the second power line POR2 may be provided on the second cell boundary CB2. The gate cutting patterns CT may be vertically overlapped with the first and second power lines POR1 and POR2. A drain voltage VDD may be applied to one of the first and second power lines POR1 and POR2, and a source voltage VSS may be applied to the other of the first and second power lines POR1 and POR2. In an embodiment, the source voltage VSS may be applied to the first power line POR1, and the drain voltage VDD may be applied to the second power line POR2.

The first to fourth interconnection lines MI1 to MI4 may be disposed between the first and second power lines POR1 and POR2. The first to fourth interconnection lines MI1 to MI4 may be line- or bar-shaped patterns extended in the second direction D2. The first and second power lines POR1 and POR2 and the first to fourth interconnection lines MI1 to MI4 may be formed of or include at least one metallic material that is selected from the group consisting of copper (Cu), aluminum (Al), ruthenium (Ru), cobalt (Co), tungsten (W), and molybdenum (Mo). As used herein, "an element A extends in a direction X" (or similar language) may mean that the element A extends longitudinally in the direction X, The first metal layer M1 may further include vias VI, which are provided in a lower portion of the fourth interlayer insulating layer 140. One of the vias VI may be used to connect the active contact AC1 or AC2 to the power line POR1 or POR2. One of the vias VI may be used to connect the first and second active contacts AC1 and AC2, which are adjacent to each other (e.g., see FIG. 4C). One of the vias VI may be used to connect the gate contact GC to at least one of the interconnection lines MI1 to MI4.

Additional metal layers (e.g., M2, M3, M4, and so forth) may be stacked on the first metal layer M1. The first metal layer M1 and the additional metal layers (e.g., M2, M3, M4, and so forth) thereon may constitute a back-end-of-line (BEOL) layer of the semiconductor device. The additional metal layers (e.g., M2, M3, M4, and so forth) on the first metal layer M1 may include routing lines, which are used to connect the logic cells to each other.

Figure 5:
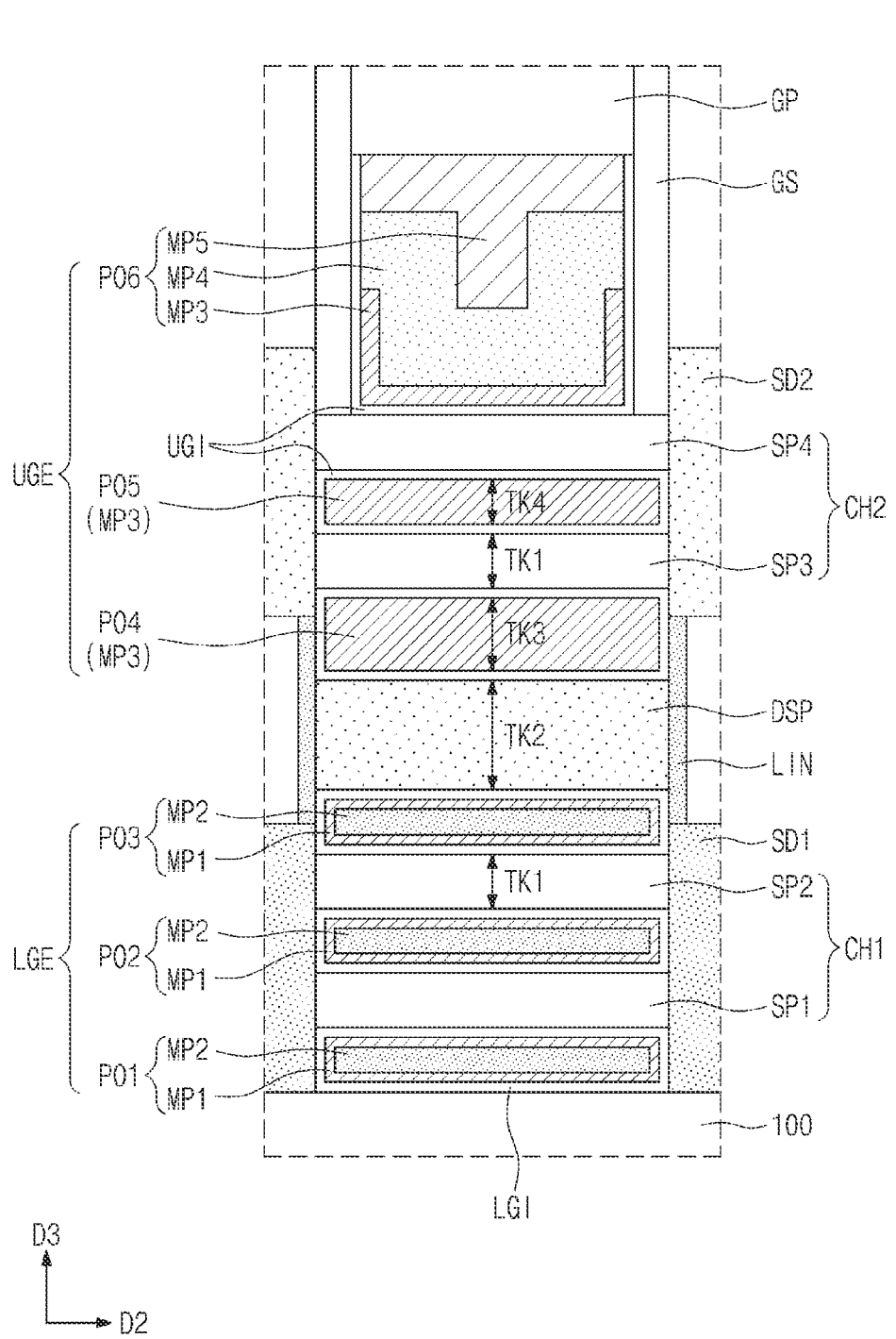
Figure 6:
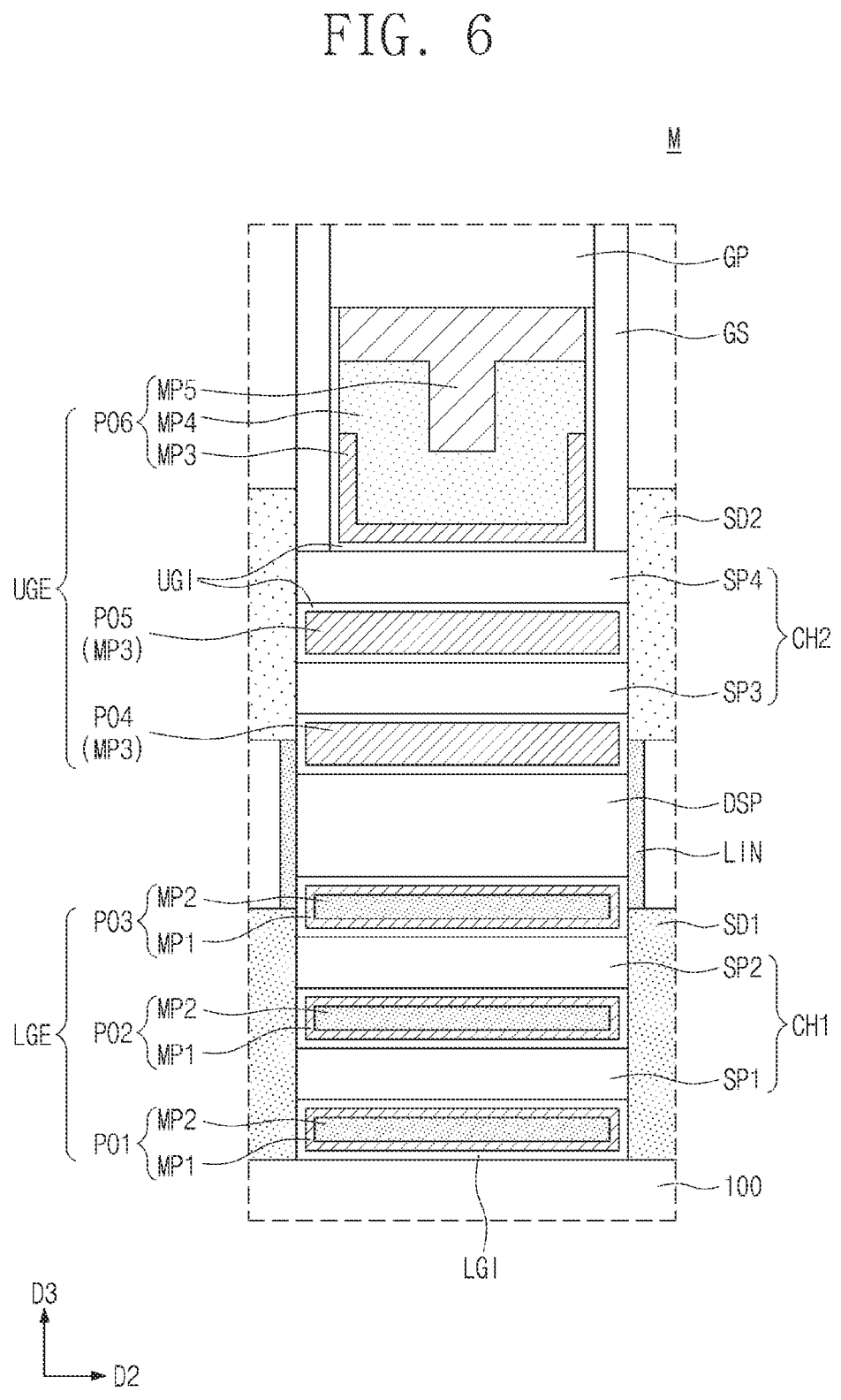
Figure 7:
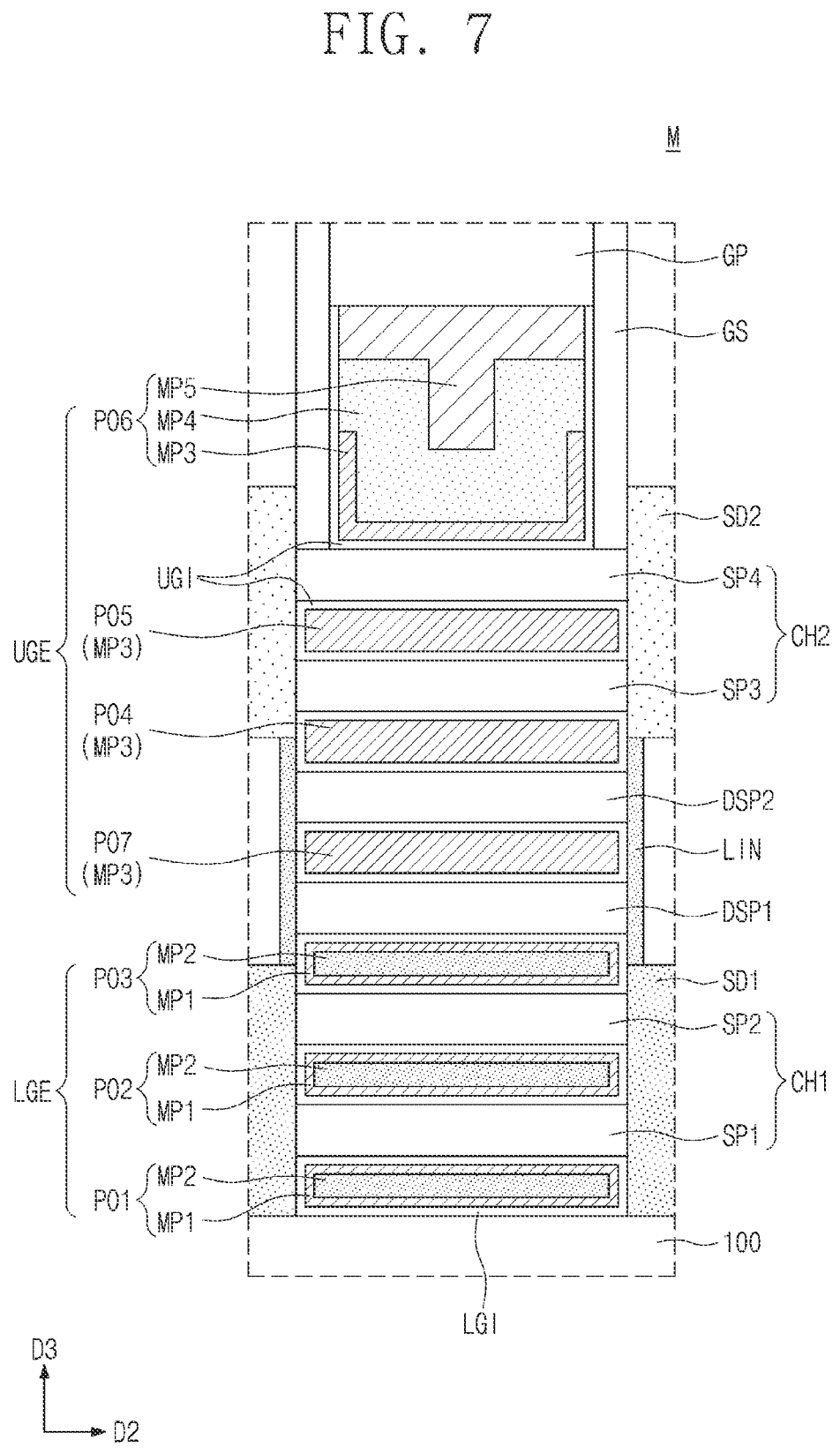

FIGS. 5 to 7 are enlarged sectional views, each of which illustrates a portion 'M' of FIG. 4A, according to an embodiment of the inventive concept. In the following description, an element previously described with reference to FIGS. 3 and 4A to 4D may be identified by the same reference number without repeating an overlapping description thereof, for the sake of brevity.

Referring to FIG. 5, each of the first to fourth semiconductor patterns SP1 to SP4 may have a first thickness TK1 in the third direction D3. The dummy channel pattern DSP may be formed of or include at least one of silicon-based insulating materials. The dummy channel pattern DSP may have a second thickness TK2 in the third direction D3. The second thickness TK2 may be equal to or larger than the first thickness TK1. For example, the second thickness TK2 may be larger than the first thickness TK1.

The fourth portion PO4 of the upper gate electrode UGE may have a third thickness TK3 in the third direction D3. The fifth portion PO5 of the upper gate electrode UGE may have a fourth thickness TK4 in the third direction D3. The third thickness TK3 may be equal to or larger than the fourth thickness TK4. For example, the third thickness TK3 may be larger than the fourth thickness TK4.

Since the third thickness TK3 of the fourth portion PO4 has a relatively large thickness, a distance between the third semiconductor pattern SP3 and the dummy channel pattern DSP may be increased. Thus, it may be possible to stably form the fourth portion PO4 during the process of forming the upper gate electrode UGE, and thereby to stably realize the lower and upper gate electrodes LGE and UGE, which have different structures in each gate electrode GE. As a result, it may be possible to improve reliability of the three-dimensional device according to an embodiment of the inventive concept.

Referring to FIG. 6, the dummy channel pattern DSP may be formed of or include at least one of semiconductor materials (e.g., silicon (Si), germanium (Ge), or silicon germanium (SiGe)). In an embodiment, the dummy channel pattern DSP may contain the same element (e.g., silicon (Si)) as the first to fourth semiconductor patterns SP1 to SP4. For example, a content of silicon (Si) in the dummy channel pattern DSP may be higher than 98 at %.

Referring to FIG. 7, the dummy channel pattern DSP may include a first dummy channel pattern DSP1 and a second dummy channel pattern DSP2. The second dummy channel pattern DSP2 may be provided on the first dummy channel pattern DSP1 and may be vertically spaced apart from the first dummy channel pattern DSP1. Opposite side surface of each of the first and second dummy channel patterns DSP1 and DSP2 may be covered with a pair of the liner layers LIN.

The first and second dummy channel patterns DSP1 and DSP2 may be formed of or include the same material as each other. In an embodiment, the first and second dummy channel patterns DSP1 and DSP2 may be formed of or include a semiconductor material. In another embodiment, the first and second dummy channel patterns DSP1 and DSP2 may be formed of or include a silicon-containing insulating material.

The upper gate electrode UGE may include a seventh portion PO7 interposed between the first and second dummy channel patterns DSP1 and DSP2. The seventh portion PO7 may be composed of the third metal pattern MP3.

FIGS. 8A to 17B are sectional views illustrating a method of fabricating a semiconductor device, according to an embodiment of the inventive concept. In detail, FIGS. 8A, 9A, 10A, 11A, 12A, 13A, 14A, 15A, 16A, and 17A are sectional views corresponding to a line A-A' of FIG. 3.

FIGS. 10B, 11B, 12B, and 13B are sectional views corresponding to a line C-C' of FIG. 5. FIGS. 8B, 9B, 14B, 15B, 16B, and 17B are sectional views corresponding to a line D-D' of FIG. 3.

Figure 8A:
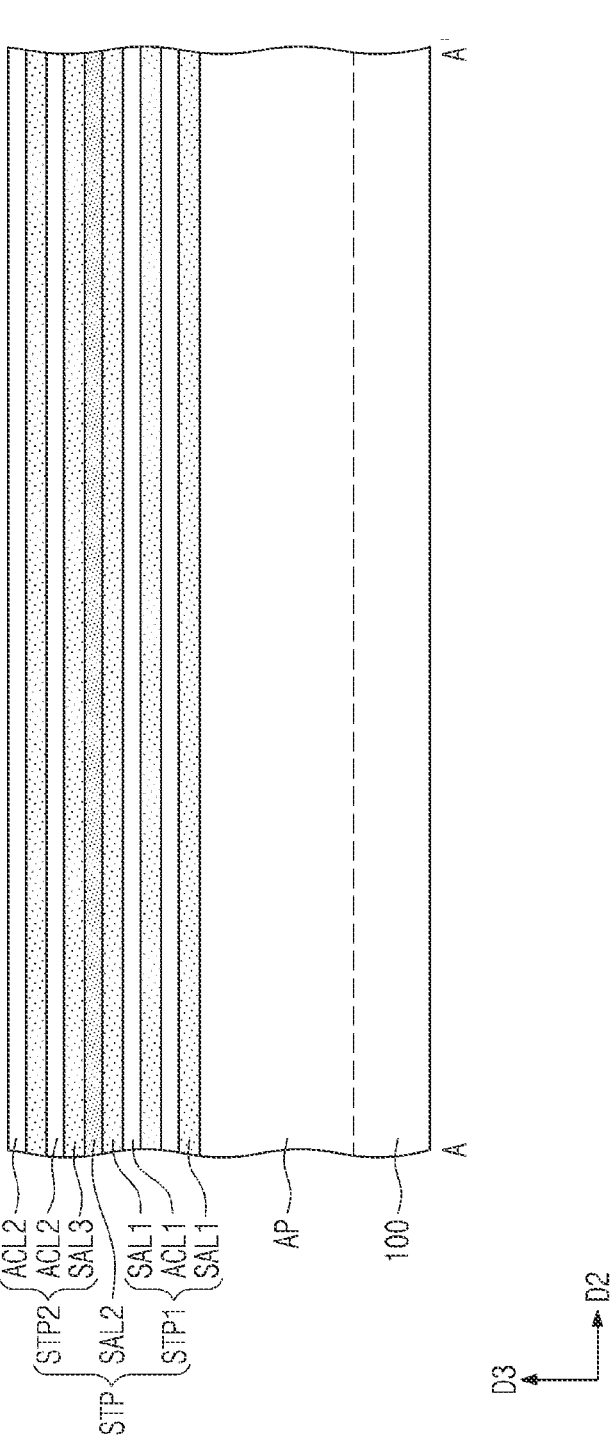
Figure 8B:
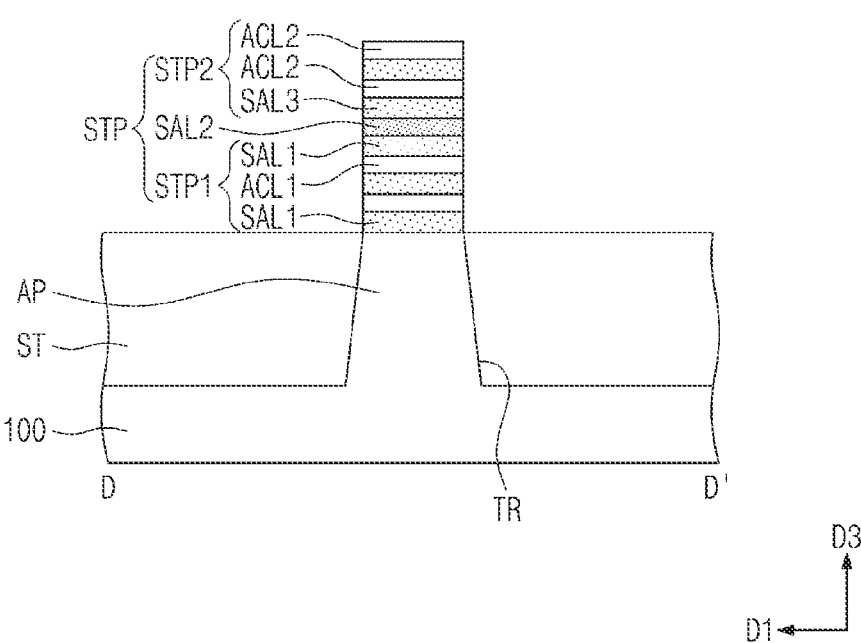

Referring to FIGS. 8A and 8B, first sacrificial layers SAL1 and first active layers ACL1 may be alternately stacked on the substrate 100. The first sacrificial layers SAL1 may be formed of or include one of silicon (Si), germanium (Ge), and silicon germanium (SiGe), and the first active layers ACL1 may be formed of or include another of silicon (Si), germanium (Ge), and silicon germanium (SiGe). For example, the first sacrificial layers SAL1 may be formed of or include silicon germanium (SiGe), and the first active layers ACL1 may be formed of or include silicon (Si). For example, a concentration of germanium (Ge) in each of the first sacrificial layers SAL1 may range from about 10 at % to about 30 at %.

A second sacrificial layer SAL2 may be formed on the uppermost one of the first active layers ACL1. In an embodiment, a thickness of the second sacrificial layer SAL2 may be substantially equal to a thickness of the first sacrificial layer SAL1. In some embodiments, the thickness of the second sacrificial layer SAL2 may be larger than a thickness of each of the first active layer ACL1 and the first sacrificial layer SAL1. The second sacrificial layer SAL2 may be formed of or include silicon (Si) or silicon germanium (SiGe). In the case where the second sacrificial layer SAL2 includes silicon germanium (SiGe), a concentration of germanium (Ge) in the second sacrificial layer SAL2 may be higher than that in the first sacrificial layer SAL1. For example, the germanium concentration of the second sacrificial layer SAL2 may range from about 40 at % to about 90 at %.

Third sacrificial layers SAL3 and second active layers ACL2 may be alternately stacked on the second sacrificial layer SAL2. Each of the third sacrificial layers SAL3 may be formed of or include the same material as the first sacrificial layer SAL1, and each of the second active layers ACL2 may be formed of or include the same material as the first active layer ACL1. The second sacrificial layer SAL2 may be interposed between the first sacrificial layer SAL1 and the third sacrificial layer SAL3.

A stacking pattern STP may be formed by patterning the stack of the first to third sacrificial layers SAL1, SAL2, and SAL3 and the first and second active layers ACL1 and ACL2. The formation of the stacking pattern STP may include forming a hard mask pattern on the uppermost one of the second active layers ACL2 and etching the layers (e.g., SAL1, SAL2, SAL3, ACL1, and ACL2), which are stacked on the substrate 100, using the hard mask pattern as an etch mask. During the formation of the stacking pattern STP, an upper portion of the substrate 100 may be patterned to form the trench TR defining the active pattern AP. The stacking pattern STP may be a bar-shaped pattern extended in the second direction D2.

The stacking pattern STP may include a lower stacking pattern STP1 on the active pattern AP, an upper stacking pattern STP2 on the lower stacking pattern STP1, and the second sacrificial layer SAL2 between the lower and upper stacking patterns STP1 and STP2. The lower stacking pattern STP1 may include the first sacrificial layers SAL1 and the first active layers ACL1, which are alternately stacked. The upper stacking pattern STP2 may include the third sacrificial layers SAL3 and the second active layers ACL2, which are alternately stacked.

The device isolation layer ST may be formed on the substrate 100 to fill the trench TR. In detail, an insulating layer may be formed on the substrate 100 to cover the active pattern AP and the stacking pattern STP. The device isolation layer ST may be formed by recessing the insulating layer until the stacking pattern STP is exposed.

Figure 9A:
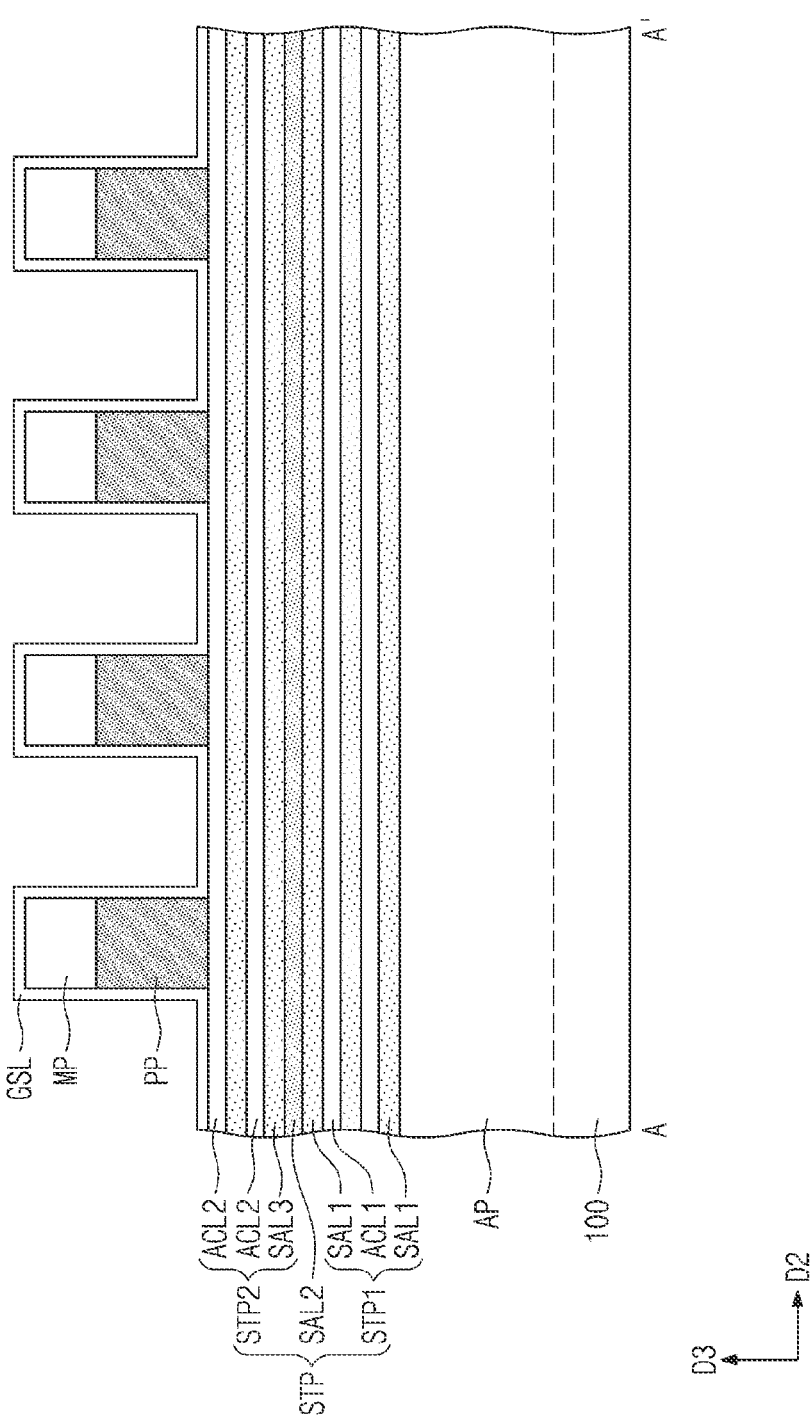
Figure 9B:
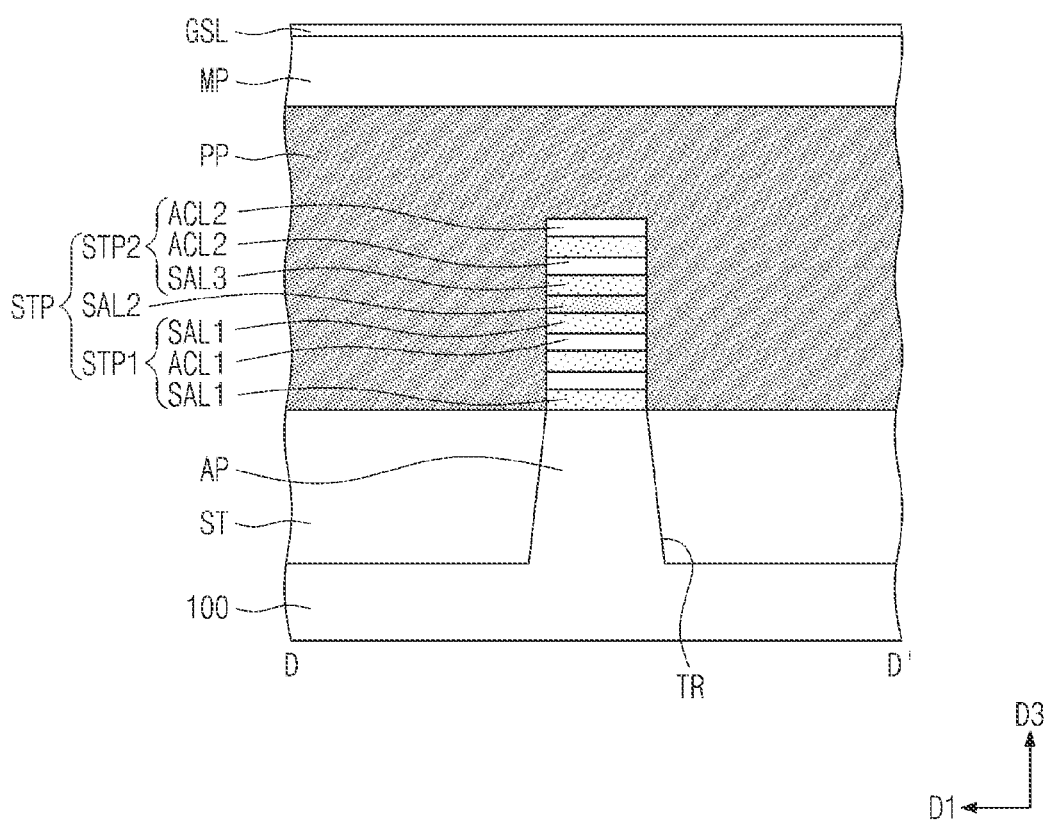

Referring to FIGS. 9A and 9B, sacrificial patterns PP may be formed to cross the stacking pattern STP. Each of the sacrificial patterns PP may be formed to have a line shape extending in the first direction D1. The sacrificial patterns PP may be arranged in the second direction D2 with a first pitch.

In detail, the formation of the sacrificial patterns PP may include forming a sacrificial layer on the substrate 100, forming hard mask patterns MP on the sacrificial layer, and patterning the sacrificial layer using the hard mask patterns MP as an etch mask. The sacrificial layer may be formed of or include amorphous silicon and/or polysilicon. As used herein the term "and/or" includes any and all combinations of one or more of the associated listed items.

A spacer layer GSL may be conformally formed on the substrate 100. The spacer layer GSL may cover the sacrificial patterns PP and the hard mask patterns MP. For example, the spacer layer GSL may be formed of or include at least one of SiCN, SiCON, or SiN.

Figure 10A:
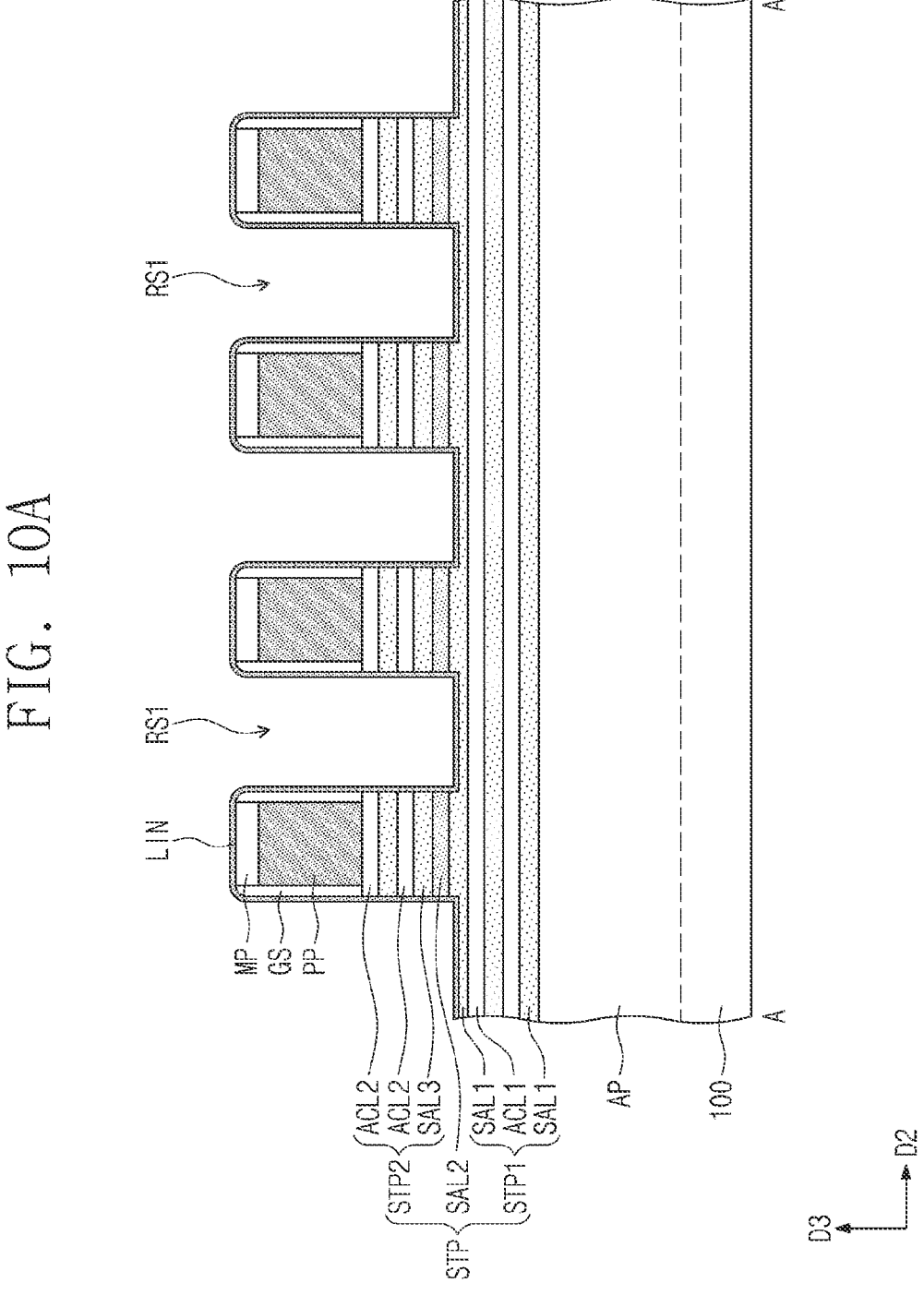
Figure 10B:
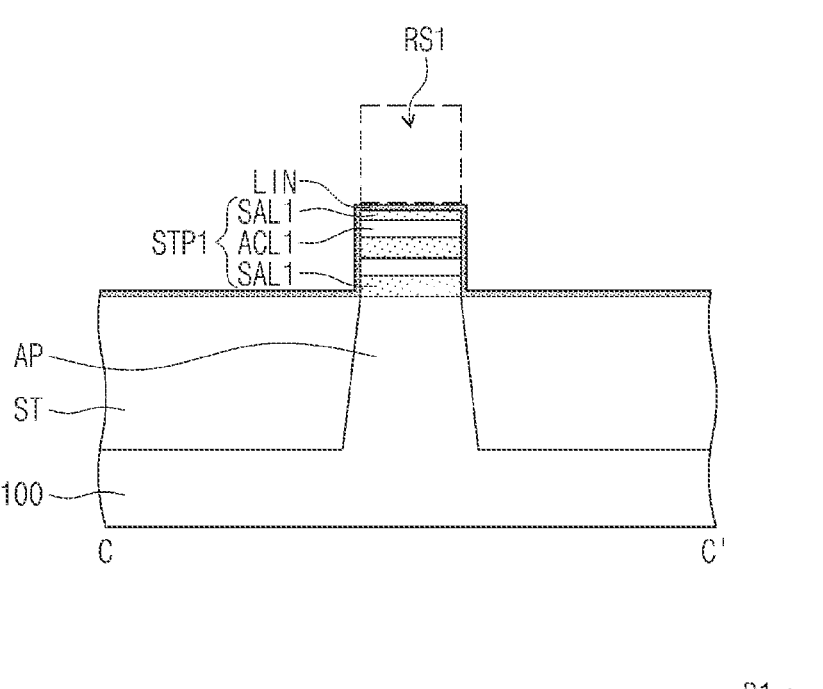

Referring to FIGS. 10A and 10B, a first etching process using the spacer layer GSL and the hard mask patterns MP as an etch mask may be performed on the stacking pattern STP. As a result of the first etching process, a first recess RS1 may be formed in the stacking pattern STP between the sacrificial patterns PP. The first recess RS1 may be formed between a pair of the sacrificial patterns PP.

The first etching process may be an anisotropic etching process. As a result of the first etching process, the gate spacer GS covering a side surface of the sacrificial pattern PP may be formed from the spacer layer GSL. The first etching process may be performed to expose the uppermost one of the first sacrificial layers SAL1 of the lower stacking pattern STP1. In other words, the first recess RS1 may be formed to expose the lower stacking pattern STP1 (e.g., see FIG. 10B).

The liner layer LIN may be conformally formed on the substrate 100. The liner layer LIN may cover the gate spacers GS and the hard mask patterns MP. The liner layer LIN may cover an inner surface of the first recess RS1. The liner layer LIN may cover the exposed portions of the lower stacking pattern STP1. In an embodiment, the liner layer LIN may be formed of or include, for example, silicon nitride.

Figure 11A:
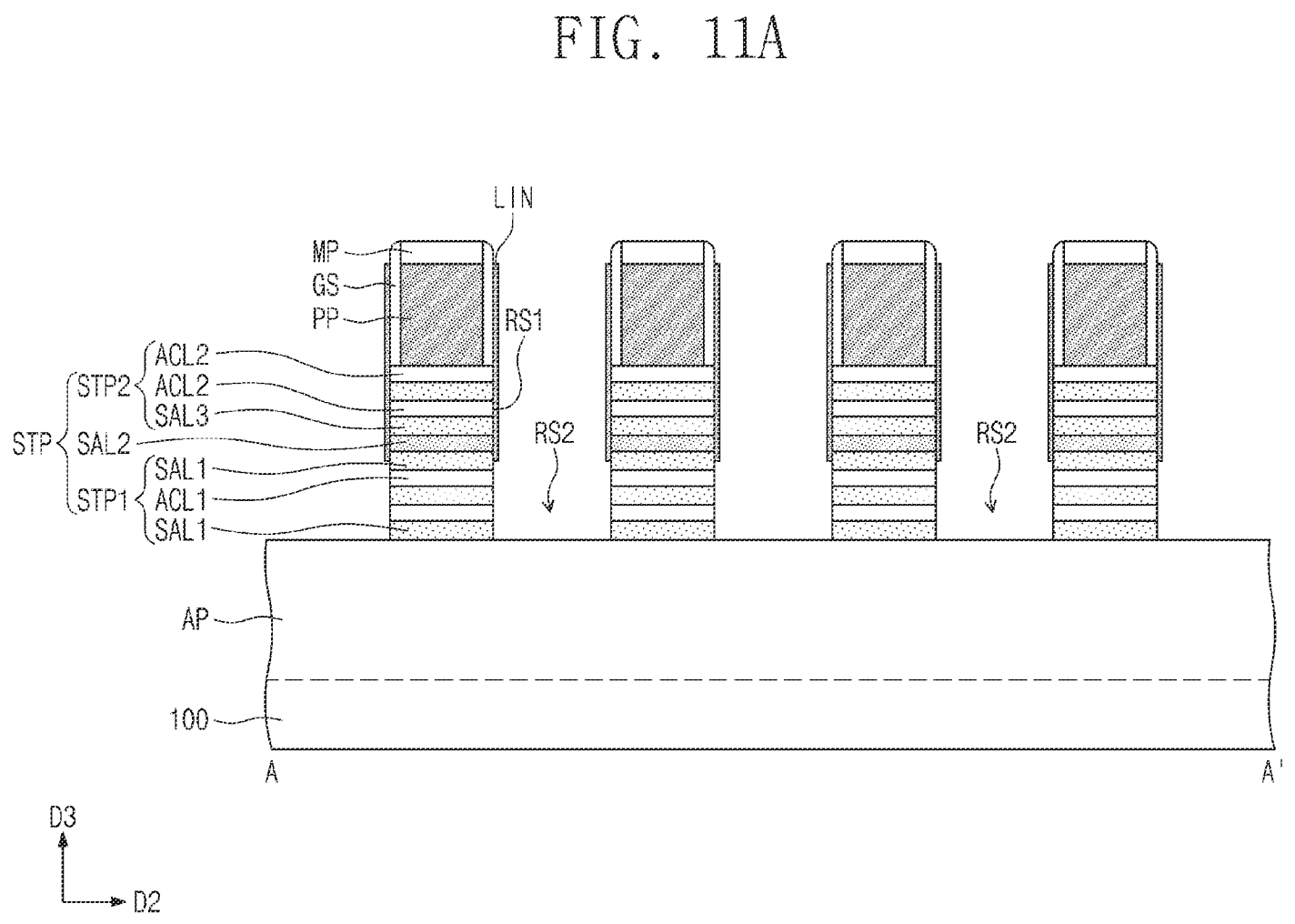
Figure 11B:
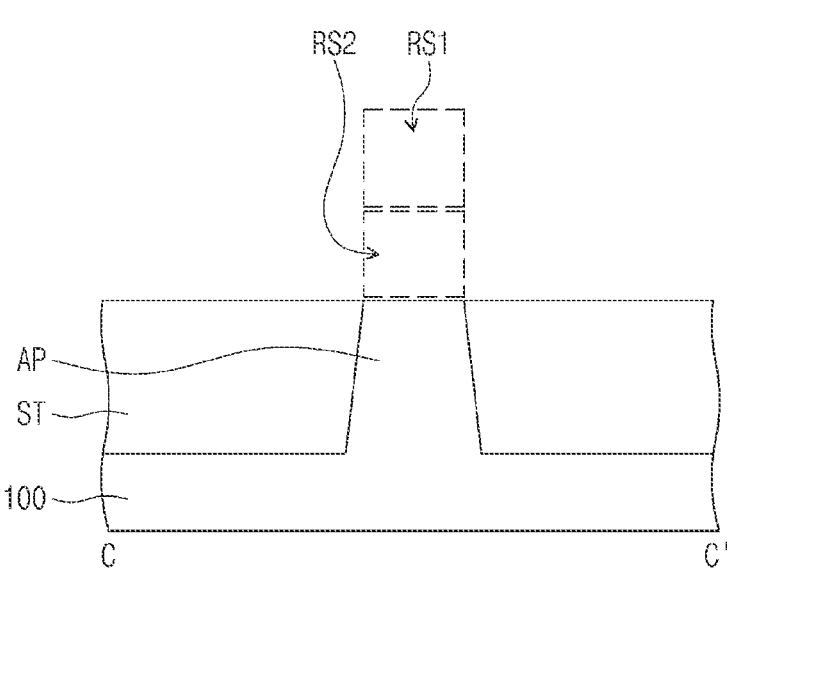

Referring to FIGS. 11A and 11B, a second etching process using the liner layer LIN, the gate spacers GS, and the hard mask patterns MP as an etch mask may be performed on the stacking pattern STP. As a result of the second etching process, the lower stacking pattern STP1 between the sacrificial patterns PP may be removed to form a second recess RS2. The second recess RS2 may be further extended from the first recess RS1 in a downward direction.

The second etching process may be an anisotropic etching process. The second etching process may be performed to expose the top surface of the active pattern AP. In other words, the second recess RS2 may be formed to expose the top surface of the active pattern AP.

Figure 12A:
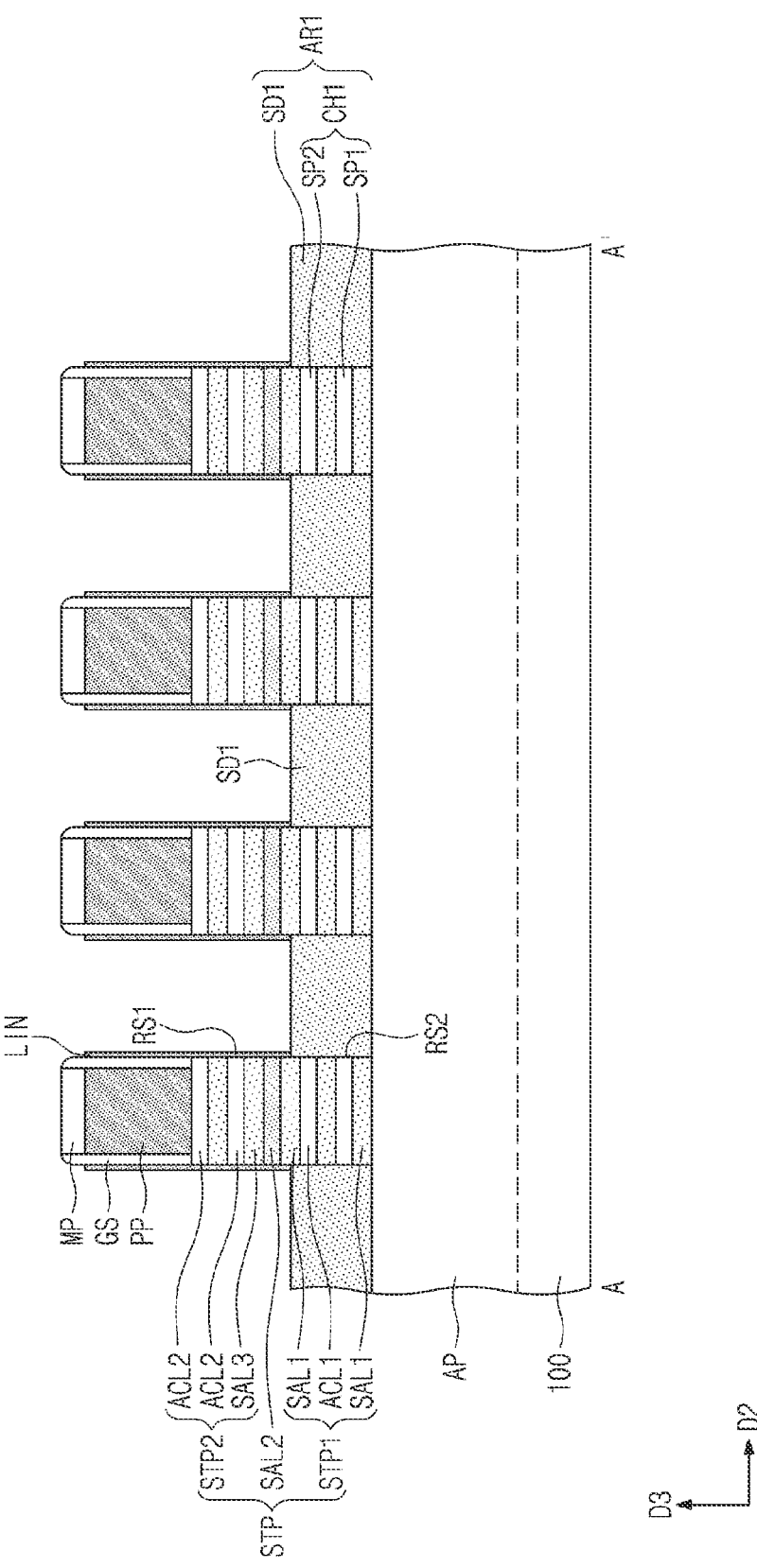
Figure 12B:
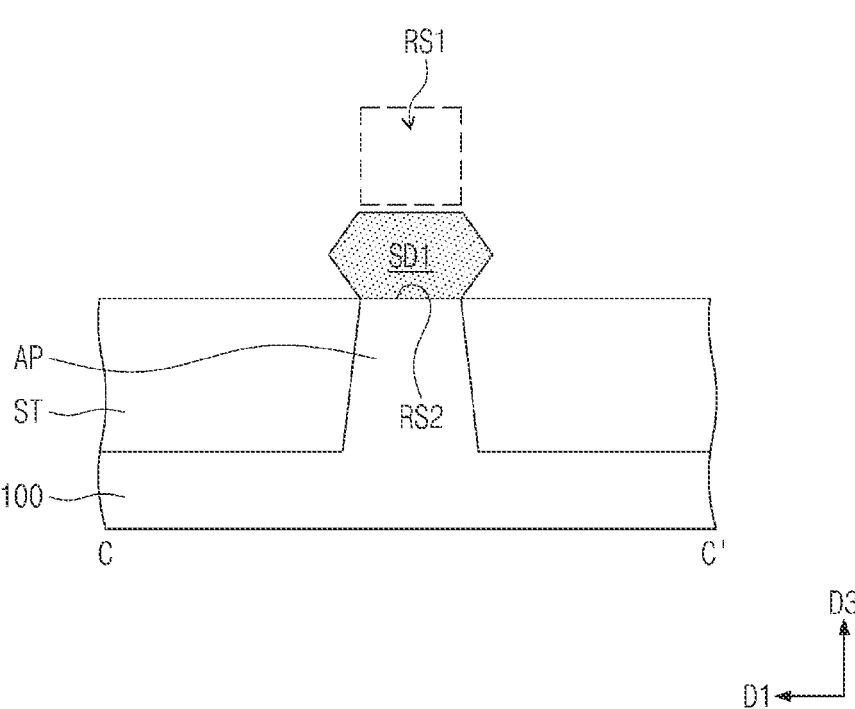

Referring to FIGS. 12A and 12B, the lower source/drain patterns SD1 may be formed in the second recesses RS2, respectively. In detail, the lower source/drain pattern SD1 may be formed by performing a first SEG process using an inner surface of the second recess RS2 as a seed layer. The lower source/drain pattern SD1 may be grown using the first active layers ACL1 and the substrate 100, which are exposed through the second recess RS2, as a seed layer. In an embodiment, the first SEG process may include a chemical vapor deposition (CVD) process and/or a molecular beam epitaxy (MBE) process.

During the first SEG process, impurities or dopants may be injected into the lower source/drain pattern SD1 in an in-situ manner. In some embodiments, the impurities may be injected into the lower source/drain pattern SD1 by an ion-implantation process performed after the formation of the lower source/drain pattern SD1. The lower source/drain pattern SD1 may be doped to have a first conductivity type (e.g., n-type).

The first active layers ACL1, which are interposed between a pair of the lower source/drain patterns SD1, may constitute the lower channel pattern CH1. In other words, the first and second semiconductor patterns SP1 and SP2 of the lower channel pattern CH1 may be formed from the first active layers ACL1. The lower channel patterns CH1 and the lower source/drain patterns SD1 may constitute the first active region AR1, which is the bottom tier of the three-dimensional device.

The inner surface of the first recess RS1 may be covered with the liner layer LIN. That is, due to the liner layer LIN, the second active layers ACL2 of the upper stacking pattern STP2 may not be exposed to the outside during the first SEG process. Thus, it may be possible to hinder or prevent growth of an additional semiconductor layer in the first recess RS1, during the first SEG process.

Figure 13A:
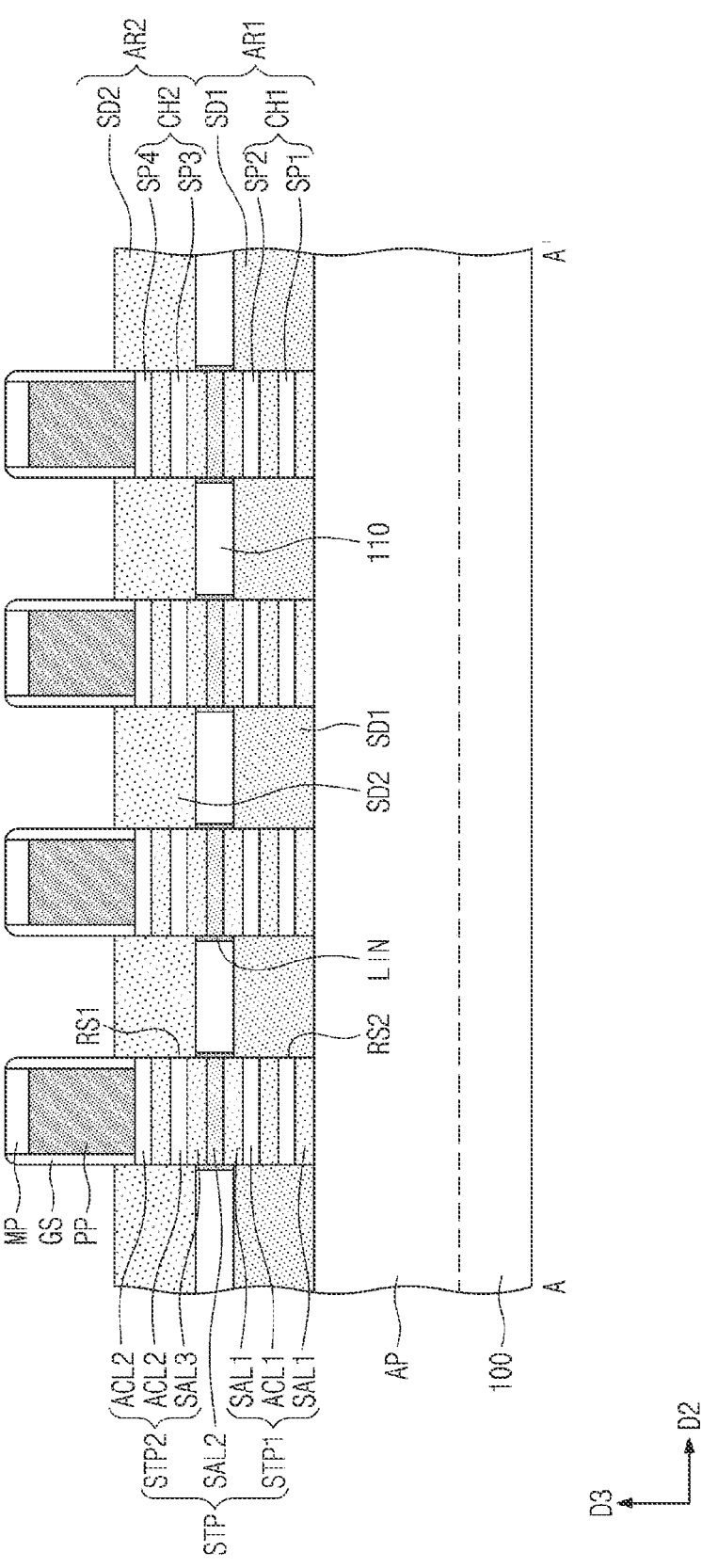
Figure 13B:
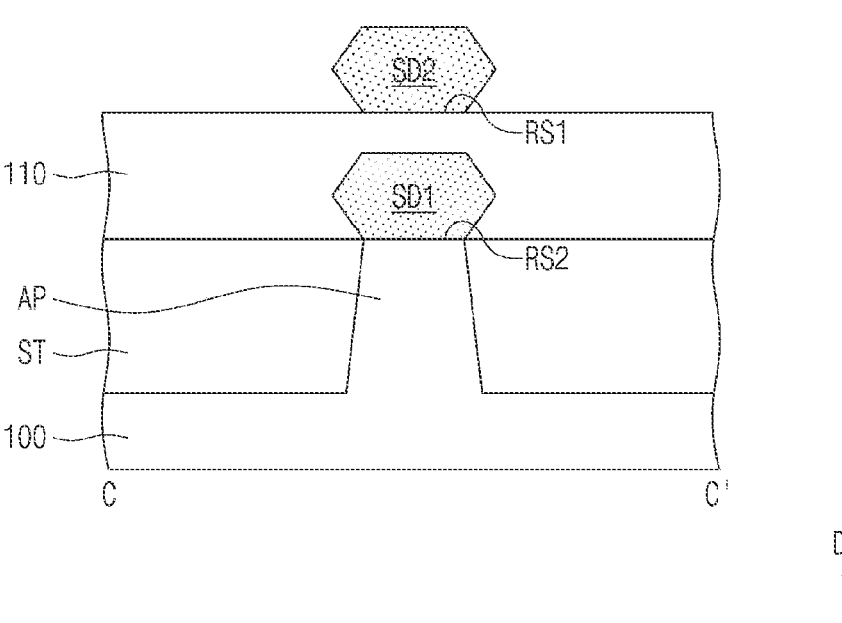

Referring to FIGS. 13A and 13B, the first interlayer insulating layer 110 may be formed to cover the lower source/drain patterns SD1. A top surface of the first interlayer insulating layer 110 may be recessed to a level lower than a bottom surface of the lowermost one of the second active layers ACL2.

The liner layer LIN exposed by the first recess RS1 may be partially removed. A portion of the liner layer LIN, which is covered with the first interlayer insulating layer 110, may be left to cover a portion of a side surface of the second sacrificial layer SAL2. As a result of the partial removal of the liner layer LIN, the second active layers ACL2 may be exposed to the outside through the first recess RS1.

The upper source/drain patterns SD2 may be formed in the first recesses RS1, respectively. In detail, a second SEG process, in which the inner surface of the first recess RS1 is used as a seed layer, may be performed to form the upper source/drain pattern SD2. The upper source/drain pattern SD2 may be grown using the second active layers ACL2, which are exposed through the first recess RS1, as a seed layer. The upper source/drain patterns SD2 may be doped to have a second conductivity type (e.g., p-type) different from the first conductivity type.

The second active layers ACL2, which are interposed between a pair of the upper source/drain patterns SD2, may constitute the upper channel pattern CH2. That is, the third and fourth semiconductor patterns SP3 and SP4 of the upper channel pattern CH2 may be formed from the second active layers ACL2. The upper channel patterns CH2 and the upper source/drain patterns SD2 may constitute the second active region AR2, which is the top tier of the three-dimensional device.

Figure 14A:
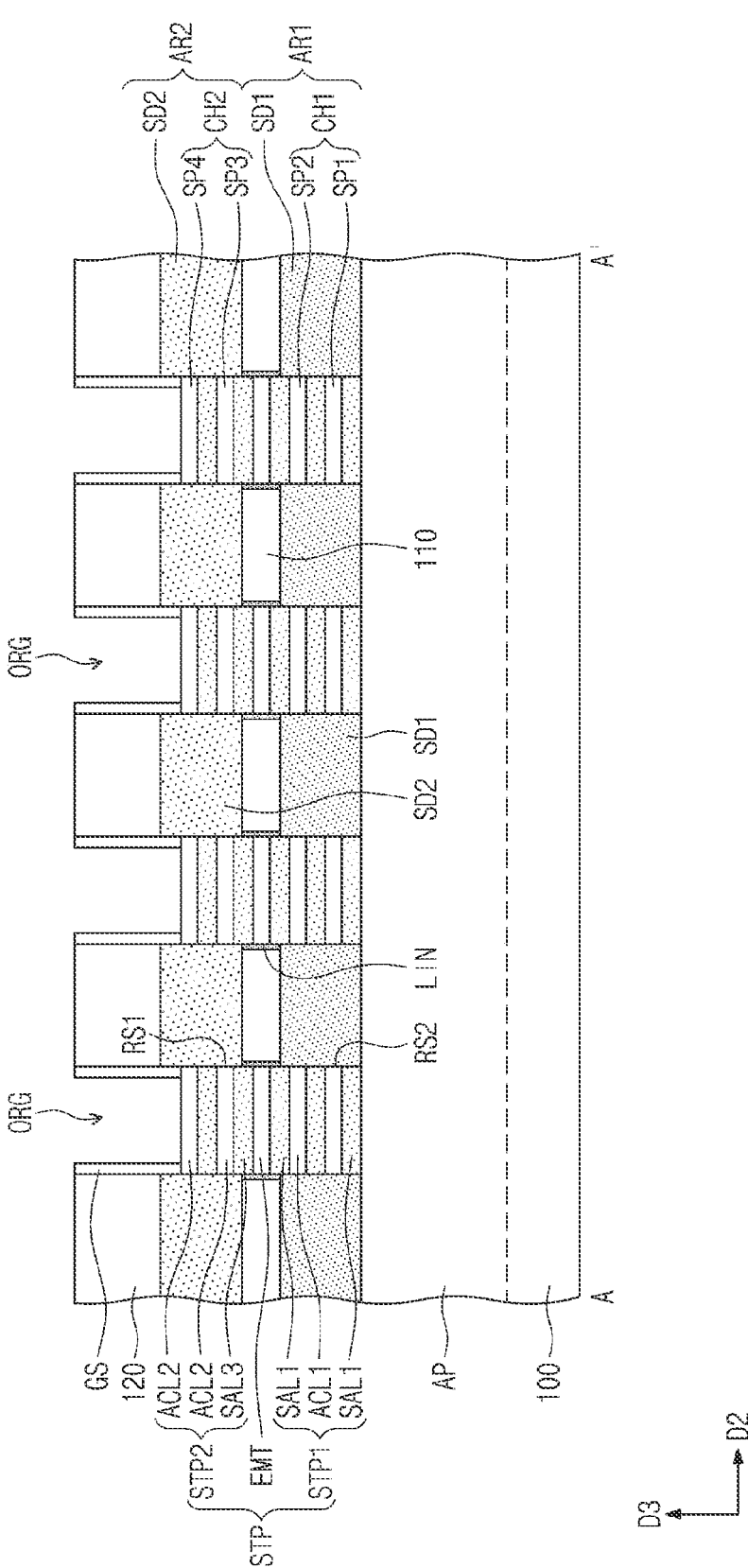
Figure 14B:
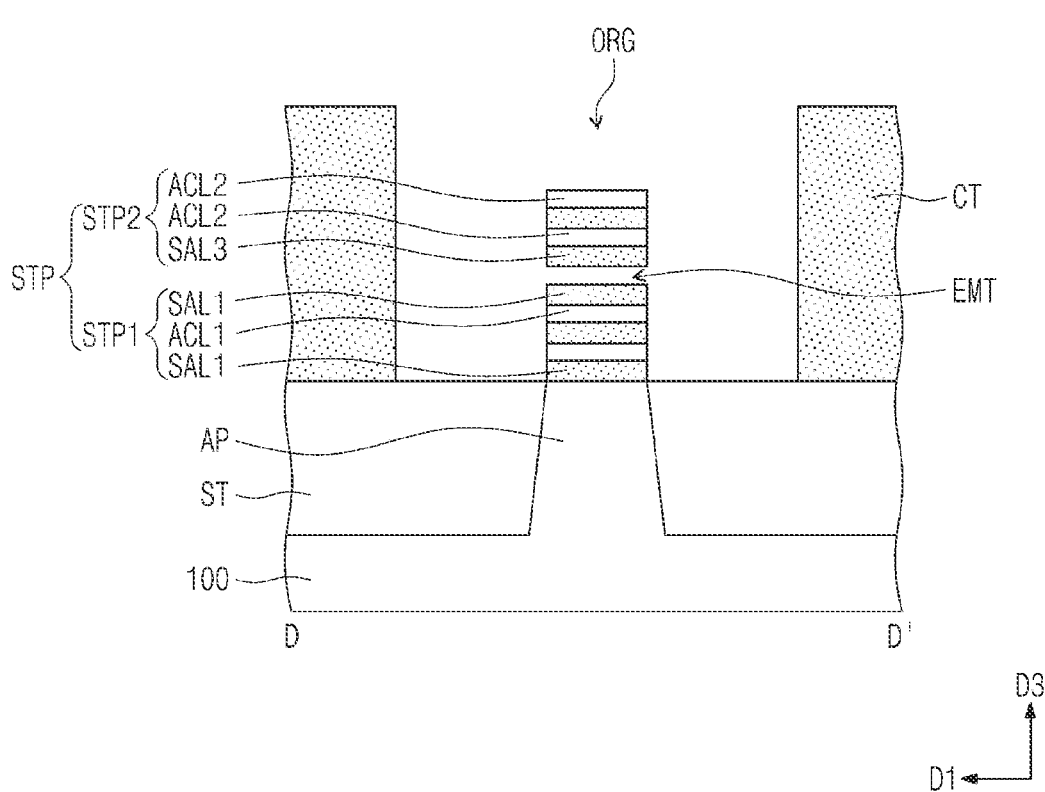

Referring to FIGS. 14A and 14B, the second interlayer insulating layer 120 may be formed to cover the hard mask patterns MP, the gate spacers GS, and the upper source/drain patterns SD2. As an example, the second interlayer insulating layer 120 may include a silicon oxide layer.

The second interlayer insulating layer 120 may be planarized to expose top surfaces of the sacrificial patterns PP.

The planarization of the third interlayer insulating layer 130 may be performed using an etch-back process or a chemical mechanical polishing (CMP) process. In an embodiment, the planarization process may be performed to remove all of the hard mask patterns MP. In this case, a top surface of the third interlayer insulating layer 130 may be coplanar with the top surfaces of the sacrificial patterns PP and the top surfaces of the gate spacers GS.

The gate cutting pattern CT may be formed to penetrate the sacrificial pattern PP. The gate cutting patterns CT may be formed on the first and second cell boundaries CB1 and CB2 of the logic cell. The gate cutting patterns CT may be formed of or include, for example, silicon oxide and/or silicon nitride.

The exposed sacrificial patterns PP may be selectively removed. As a result of the removal of the sacrificial patterns PP, an outer region ORG may be formed to expose the lower and upper channel patterns CH1 and CH2 (e.g., see FIG. 14B). The removal of the sacrificial patterns PP may include, for example, a wet etching process, which is performed using etching solution capable of selectively etching poly-silicon.

The second sacrificial layer SAL2, which is exposed through the outer region ORG, may be selectively removed. In an embodiment, a concentration of germanium (Ge) in the second sacrificial layer SAL2 may be much higher than a concentration of germanium (Ge) in other layers SAL1, SAL3, ACL1, and ACL2, and this may make it possible to selectively etch only the second sacrificial layer SAL2. As a result of the selective removal of the second sacrificial layer SAL2, an empty space EMT may be formed between the lower stacking pattern STP1 and the upper stacking pattern STP2.

In some embodiments, the second sacrificial layer SAL2 may be a semiconductor layer that is made of or contains only silicon (Si). In this case, the second sacrificial layer SAL2 may not be removed and may be left along with the first and second active layers ACL1 and ACL2. The second sacrificial layer SAL2 may constitute the dummy channel pattern DSP of FIG. 6.

Figure 15A:
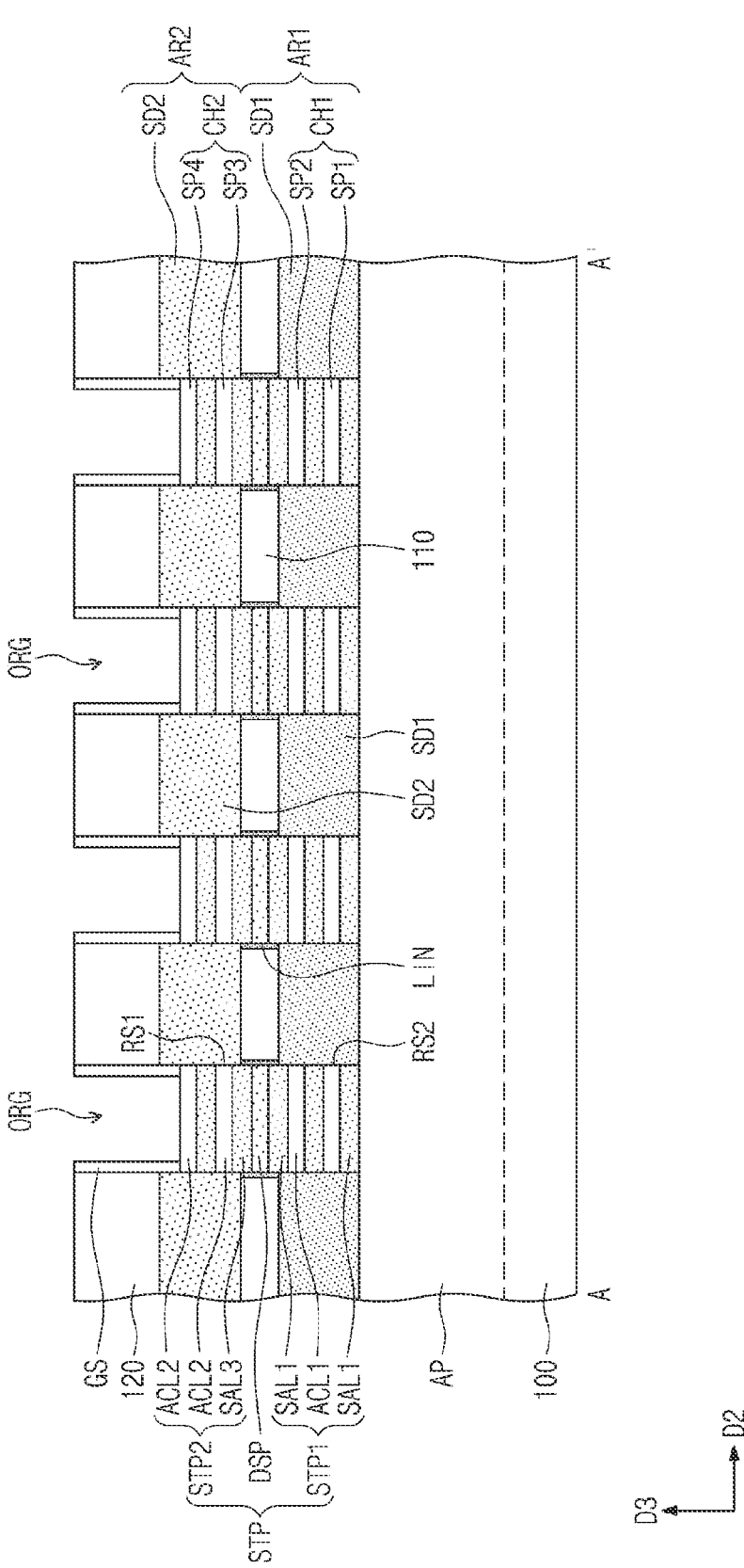
Figure 15B:
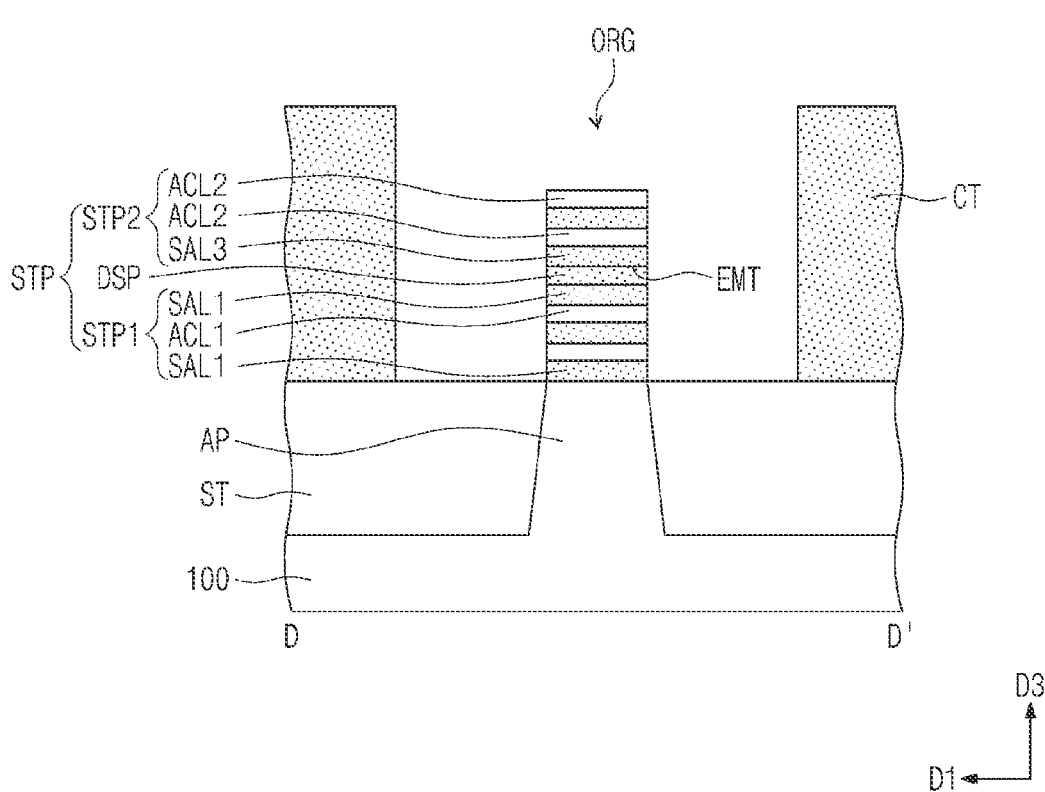

Referring to FIGS. 15A and 15B, the dummy channel pattern DSP may be formed by filling the empty space EMT with a silicon-based insulating material (e.g., silicon oxide or silicon nitride). For example, the second sacrificial layer SAL2, which is exposed through the outer region ORG, may be replaced with the dummy channel pattern DSP.

In some embodiments, an insulating material may be formed in the outer region ORG to cover the stacking pattern STP. The insulating material may be deposited to completely fill the empty space EMT. Thereafter, a wet etching process on the insulating material may be performed to expose the stacking pattern STP. The dummy channel pattern DSP may be a portion of the insulating material, which is left in the empty space EMT.

Figure 16A:
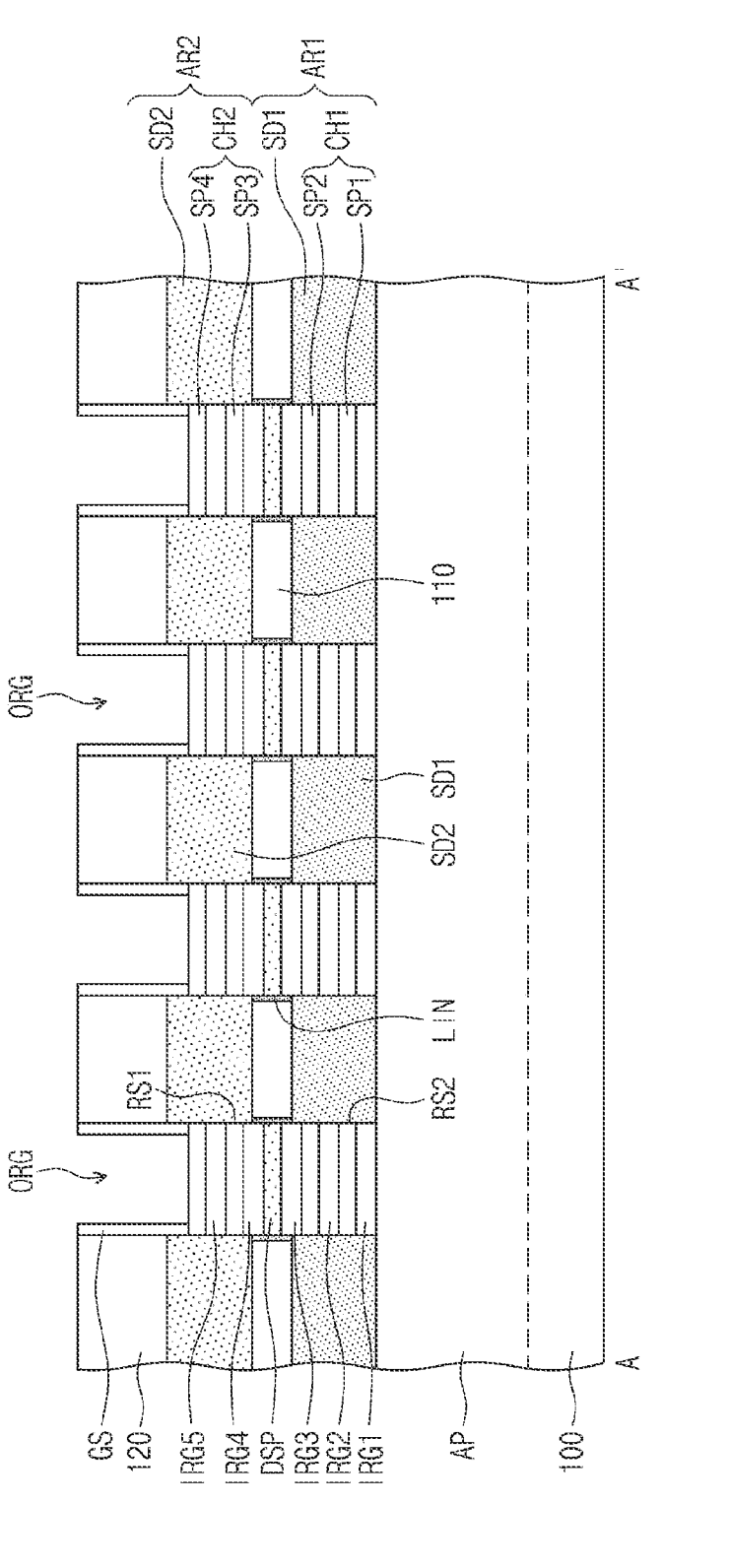
Figure 16B:
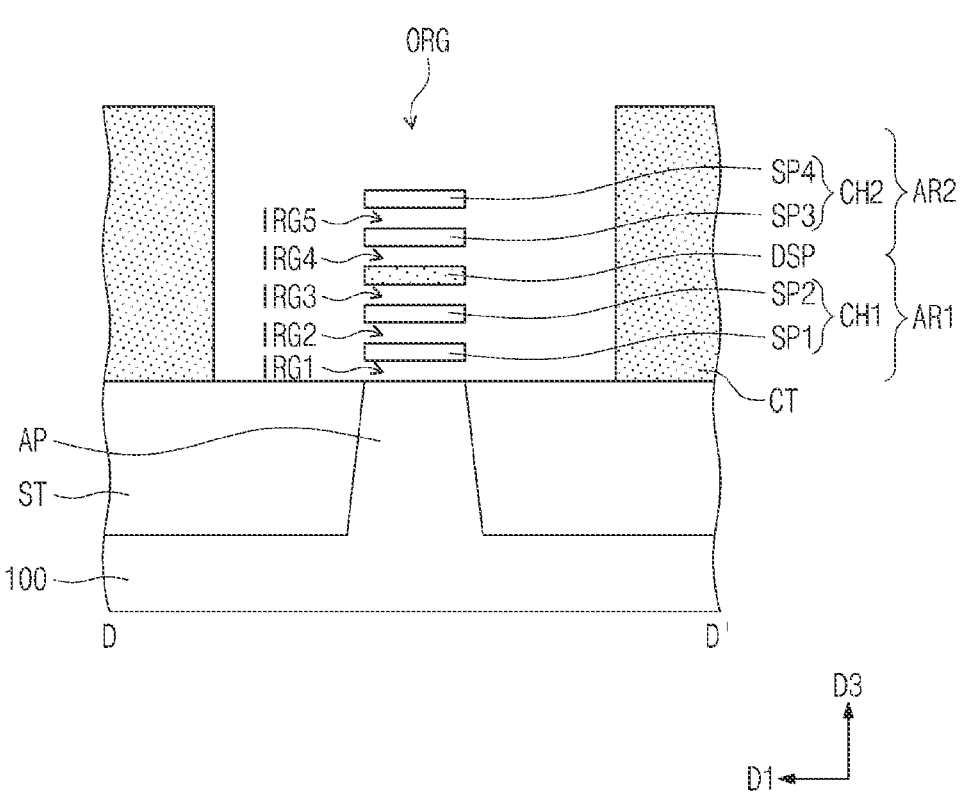

Referring to FIGS. 16A and 16B, the first and third sacrificial layers SAL1 and SAL3, which are exposed through the outer region ORG, may be selectively removed to form first to fifth inner regions IRG1 to IRG5, respectively (e.g., see FIG. 16B). In detail, an etching process of selectively etching the first and third sacrificial layers SAL1 and SAL3 may be performed to leave the first to fourth semiconductor patterns SP1 to SP4 and the dummy channel pattern DSP and to remove only the first and third sacrificial layers SAL1 and SAL3. An etch recipe for the etching process may be chosen to etch a layer (e.g., a silicon germanium layer) having a relatively high germanium concentration at a high etch rate. For example, in the etching process, a silicon germanium layer, in which germanium concentration is higher than 10 at %, may be etched at a high etch rate.

Since the first and third sacrificial layers SAL1 and SAL3 are selectively removed, the first and second semiconductor patterns SP1 and SP2 may be left in the first active region AR1, and the third and fourth semiconductor patterns SP3 and SP4 may be left in the second active region AR2. The dummy channel pattern DSP may be left between the second semiconductor pattern SP2 and the third semiconductor pattern SP3.

An empty space between the active pattern AP and the first semiconductor pattern SP1 may be defined as the first inner region IRG1, an empty space between the first semiconductor pattern SP1 and the second semiconductor pattern SP2 may be defined as the second inner region IRG2, and an empty space between the second semiconductor pattern SP2 and the dummy channel pattern DSP may be defined as the third inner region IRG3. An empty space between the dummy channel pattern DSP and the third semiconductor pattern SP3 may be defined as the fourth inner region IRG4, and an empty space between the third semiconductor pattern SP3 and the fourth semiconductor pattern SP4 may be defined as the fifth inner region IRG5.

Figure 17A:
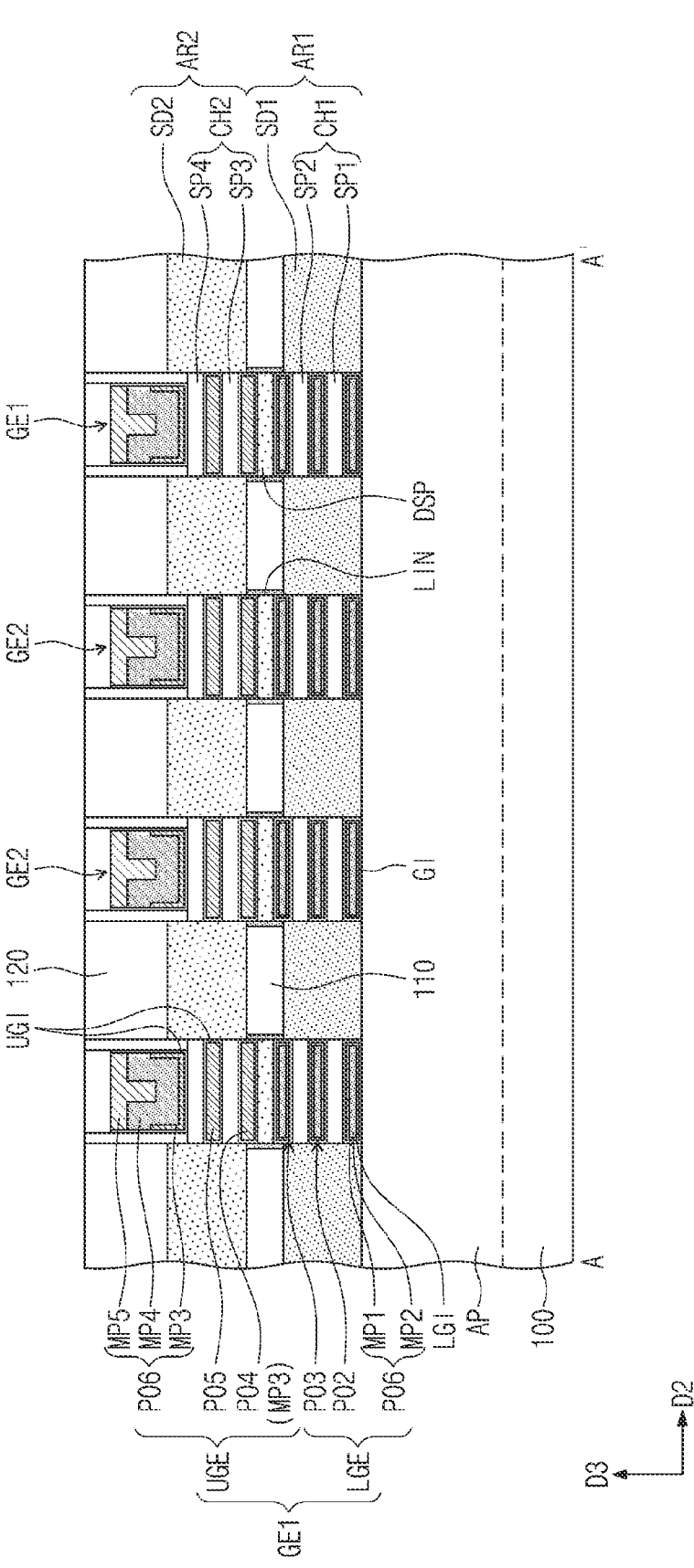
Figure 17B:
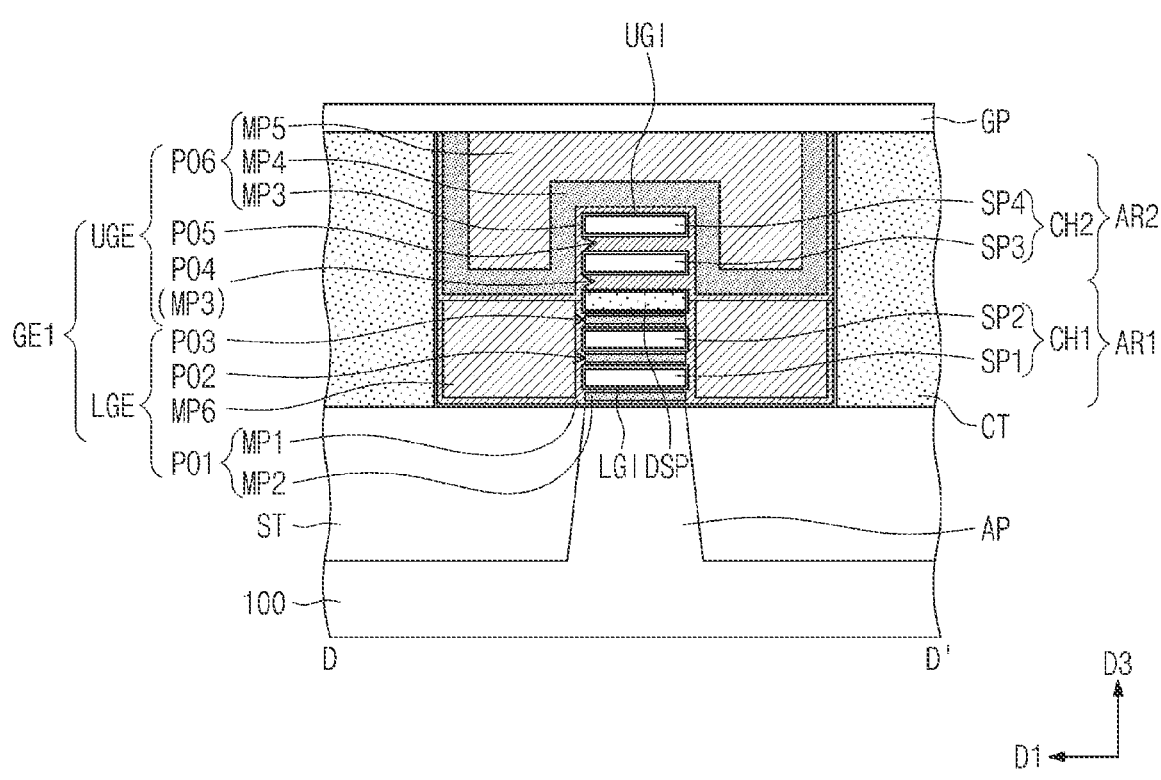

Referring to FIGS. 17A and 17B, the gate insulating layer UGI or LGI may be conformally formed on at least one of the exposed surfaces of the first to fourth semiconductor patterns SP1 to SP4. In an embodiment, the lower gate insulating layer LGI may be formed on the first and second semiconductor patterns SP1 and SP2, and the upper gate insulating layer UGI may be formed on the third and fourth semiconductor patterns SP3 and SP4.

The lower gate electrode LGE may be formed on the lower gate insulating layer LGI. The formation of the lower gate electrode LGE may include forming the first to third portions PO1 to PO3 in the first to third inner regions IRG1, IRG2, and IRG3, respectively.

The upper gate electrode UGE may be formed on the upper gate insulating layer UGI. The formation of the upper gate electrode UGE may include forming the fourth and fifth portions PO4 and PO5 in the fourth and fifth inner regions IRG4 and IRG5, respectively, and forming the sixth portion PO6 in the outer region ORG. The lower gate electrode LGE and the upper gate electrode UGE may be connected to each other to form a single gate electrode GE.

The gate electrode GE may be recessed to have a reduced height. The gate capping pattern GP may be formed on the recessed gate electrode GE. A planarization process may be performed on the gate capping pattern GP such that a top surface of the gate capping pattern GP is coplanar with a top surface of the second interlayer insulating layer 120.

Referring back to FIGS. 3 and 4A to 4D, the third interlayer insulating layer 130 may be formed on the second interlayer insulating layer 120. The first active contact AC1 may be formed to penetrate the first to third interlayer insulating layers 110, 120, and 130 and to be coupled to the lower source/drain pattern SD1. The second active contact AC2 may be formed to penetrate the second and third interlayer insulating layers 120 and 130 and to be coupled to the upper source/drain pattern SD2. The gate contact GC may be formed to penetrate the third interlayer insulating layer 130 and the gate capping pattern GP and to be coupled to the gate electrode GE.

The fourth interlayer insulating layer 140 may be formed on the third interlayer insulating layer 130. The first metal layer M1 may be formed in the fourth interlayer insulating layer 140. The formation of the first metal layer M1 may include forming the first and second power lines POR1 and POR2 and the first to fourth interconnection lines MI1 to MI4 in an upper portion of the fourth interlayer insulating layer 140.

The via VI may be formed below each of the first and second power lines POR1 and POR2 and the first to fourth interconnection lines MI1 to MI4. The first and second active contacts AC1 and AC2 and gate contacts GC may be electrically connected to the first metal layer M1 through the vias VI.

As an example, the vias VI may be formed in advance before forming the first and second power lines POR1 and POR2 and the first to fourth interconnection lines MI1 to MI4. In some embodiments, the vias VI may be formed through a dual damascene process, and in this case, the vias VI may be formed together when the first and second power lines POR1 and POR2 and the first to fourth interconnection lines MI1 to MI4 are formed.

Although not shown, a plurality of additional metal layers (e.g., M2, M3, M4, and so forth) may be further formed on the first metal layer M1. The first metal layer M1 and the additional metal layers (e.g., M2, M3, M4, and so forth) may constitute a BEOL layer of the semiconductor device.

FIGS. 18 to 23 are sectional views, which are respectively taken along a line D-D' of FIG. 3 to illustrate a method of forming a gate electrode according to an embodiment of the inventive concept.

Figure 18:
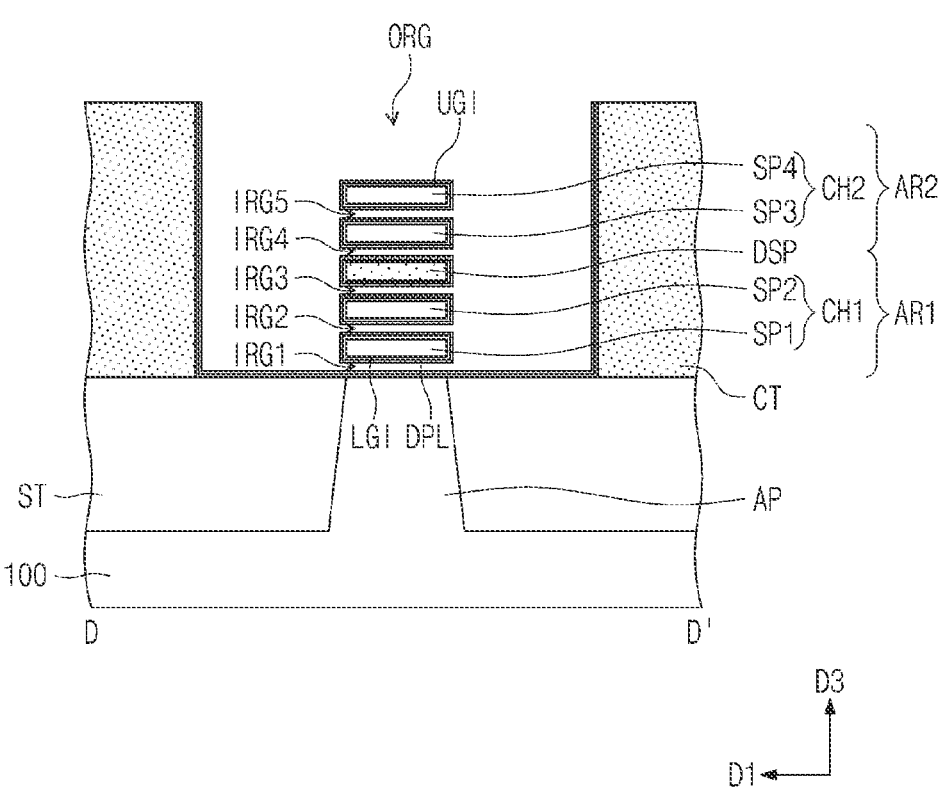
FIGS. 18 to 23 are sectional views, which are respectively taken along a line D-D' of FIG. 3 to illustrate a method of forming a gate electrode according to an embodiment of the inventive concept.

Referring to FIG. 18, the gate insulating layer UGI or LGI may be conformally formed on the structure of FIG. 16B. The gate insulating layer UGI or LGI may include the lower gate insulating layer LGI, which is provided on the first and second semiconductor patterns SP1 and SP2 and the dummy channel pattern DSP, and the upper gate insulating layer UGI, which is provided on the third and fourth semiconductor patterns SP3 and SP4.

The formation of the lower and upper gate insulating layers LGI and UGI may include forming a silicon oxide layer on surfaces of the first to fourth semiconductor patterns SP1 to SP4 and forming a high-k dielectric layer on the silicon oxide layer.

A dipole-containing layer DPL may be conformally formed on the lower and upper gate insulating layers LGI and UGI. The dipole-containing layer DPL may contain a dipole element. The dipole element may include lanthanum (La), aluminum (Al), or a combination thereof. For example, the dipole-containing layer DPL may include at least one of a lanthanum oxide layer, an aluminum oxide layer, or combinations thereof.

Figure 19:
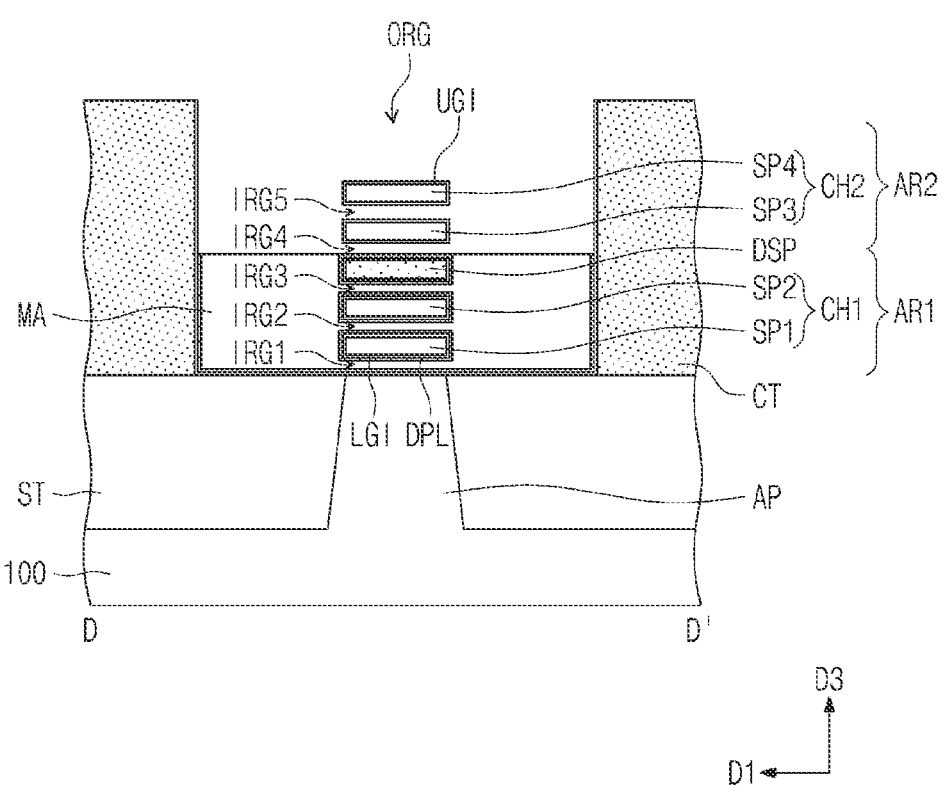

Referring to FIG. 19, a mask layer MA may be formed to cover the lower gate insulating layer LGI and to expose the upper gate insulating layer UGI. In detail, the mask layer MA may be formed to cover the lower channel pattern CH1, the dummy channel pattern DSP, and the upper channel pattern CH2. The mask layer MA may fill the first to fifth inner regions IRG1 to IRG5. In an embodiment, the mask layer MA may be formed of or include an organic polymer material.

The mask layer MA may be selectively recessed such that a top surface of the mask layer MA is located at a level similar to a top surface of the dummy channel pattern DSP. As a result of the recessing of the mask layer MA, the fourth and fifth inner regions IRG4 and IRG5 may be exposed to the outside again. In an embodiment, as a result of the recessing of the mask layer MA, the upper gate insulating layer UGI may be exposed to the outside.

The dipole-containing layer DPL on the upper gate insulating layer UGI may be selectively removed using the mask layer MA as an etch mask. Thus, the dipole-containing layer DPL may be locally left on only the lower gate insulating layer LGI, but not on the upper gate insulating layer UGI.

Next, the mask layer MA may be removed, and then, a thermal treatment process performed on the dipole-containing layer DPL to diffuse the dipole element in the dipole-containing layer DPL into the lower gate insulating layer LGI. Accordingly, a dipole-interface may be formed between the high-k dielectric layer and the silicon oxide layer of the lower gate insulating layer LGI. The dipole element, which is diffused into the lower gate insulating layer LGI, may be used to adjust an effective work function of the lower gate electrode LGE to be formed in a subsequent step.

During the thermal treatment process, the dipole-containing layer DPL may be removed, while emitting the dipole element. In an embodiment, the dipole-containing layer DPL may be formed to have an exceedingly small thickness (e.g., less than 1 nm), and in this case, the dipole-containing layer DPL may be easily removed.

According to an embodiment of the inventive concept, by using the dummy channel pattern DSP, it may be possible to completely remove the mask layer MA from the fourth and fifth inner regions IRG4 and IRG5. Since the dummy channel pattern DSP is located on the lower channel pattern CH1, the dummy channel pattern DSP may serve as a buffer protecting the lower channel pattern CH1. Thus, the mask layer MA may be completely etched such that the mask layer MA is not left in the fourth and fifth inner regions IRG4 and IRG5. As a result, the dipole element may be selectively diffused into only the lower gate insulating layer LGI, not into the upper gate insulating layer UGI.

Furthermore, the dummy channel pattern DSP according to an embodiment of the inventive concept may serve as a boundary of the lower gate electrode LGE and the upper gate electrode UGE, and thus, it may be possible to compose the lower gate electrode LGE and the upper gate electrode UGE using different layers or materials. As a result, according to an embodiment of the inventive concept, it may be possible to realize a three-dimensional device, in which NMOS- and PMOS-FETs are vertically stacked, with high reliability.

Figure 20:
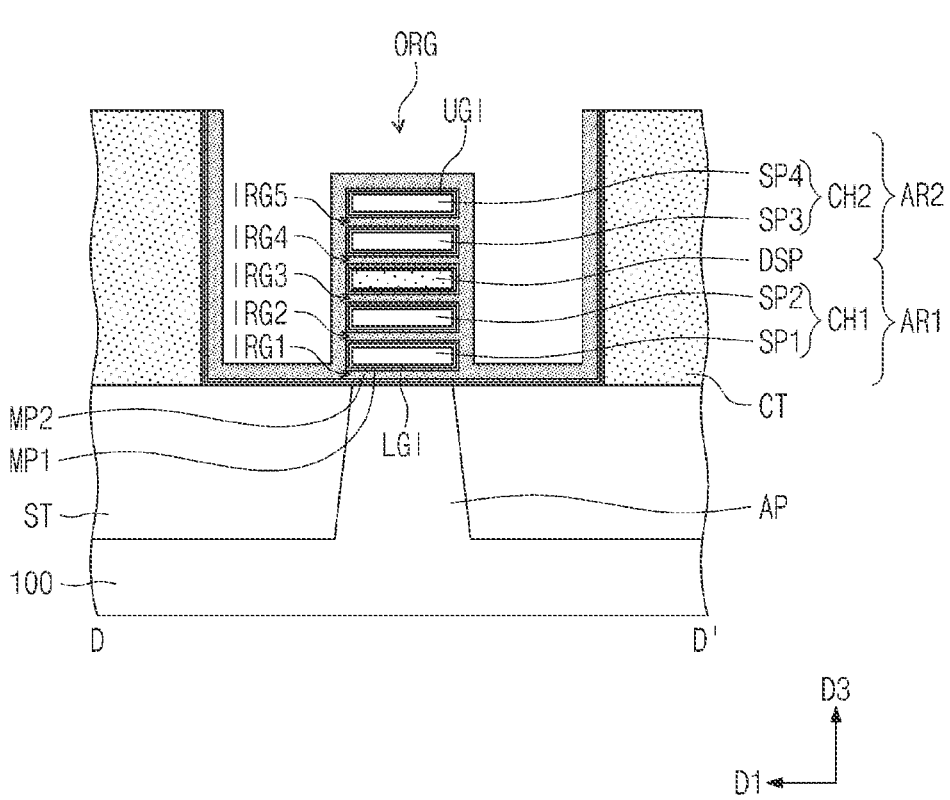

Referring to FIG. 20, the first metal pattern MP1 may be conformally formed on the lower and upper gate insulating layers LGI and UGI. The first metal pattern MP1 may be provided to enclose each of the first to fourth semiconductor patterns SP1 to SP4.

The first metal pattern MP1 may include a first work function metal (e.g., p-type work function metal). The formation of the first metal pattern MP1 may include conformally depositing a metal nitride layer on the lower and upper gate insulating layers LGI and UGI. For example, the first metal pattern MP1 may be formed of or include at least one of titanium nitride (TiN), tantalum nitride (TaN), titanium oxynitride (TiON), titanium silicon nitride (TiSiN), titanium aluminum nitride (TiAlN), tungsten carbon nitride (WCN), or molybdenum nitride (MoN).

The second metal pattern MP2 may be formed on the first metal pattern MP1. The second metal pattern MP2 may be formed to fully fill remaining regions of the first to fifth inner regions IRG1 to IRG5. The second metal pattern MP2 may also be formed in the outer region ORG.

The second metal pattern MP2 may include a second work function metal (e.g., n-type work function metal). The formation of the second metal pattern MP2 may include depositing at least one of metal carbides, which are doped with silicon and/or aluminum and contain silicon and/or aluminum, on the first metal pattern MP1. For example, the second metal pattern MP2 may be formed of or include at least one of aluminum-doped titanium carbide (TiAlC), aluminum-doped tantalum carbide (TaAlC), aluminum-doped vanadium carbide (VAlC), silicon-doped titanium carbide (TiSiC), or silicon-doped tantalum carbide (TaSiC).

Figure 21:
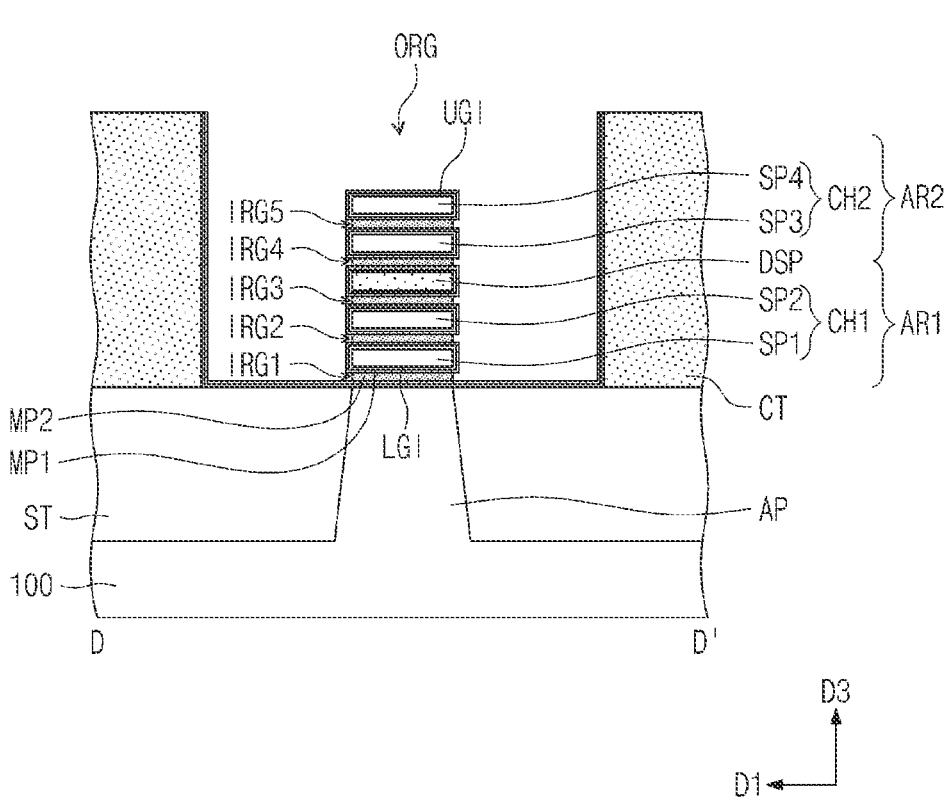

Referring to FIG. 21, an etching process may be performed on the second metal pattern MP2 to remove the second metal pattern MP2 from the outer region ORG. The etching process may include a wet etching process of selectively removing only the second metal pattern MP2. A portion of the second metal pattern MP2 in the outer region ORG may be removed, and other portions of the second metal pattern MP2 in the first to fifth inner regions IRG1 to IRG5 may remain.

Figure 22:
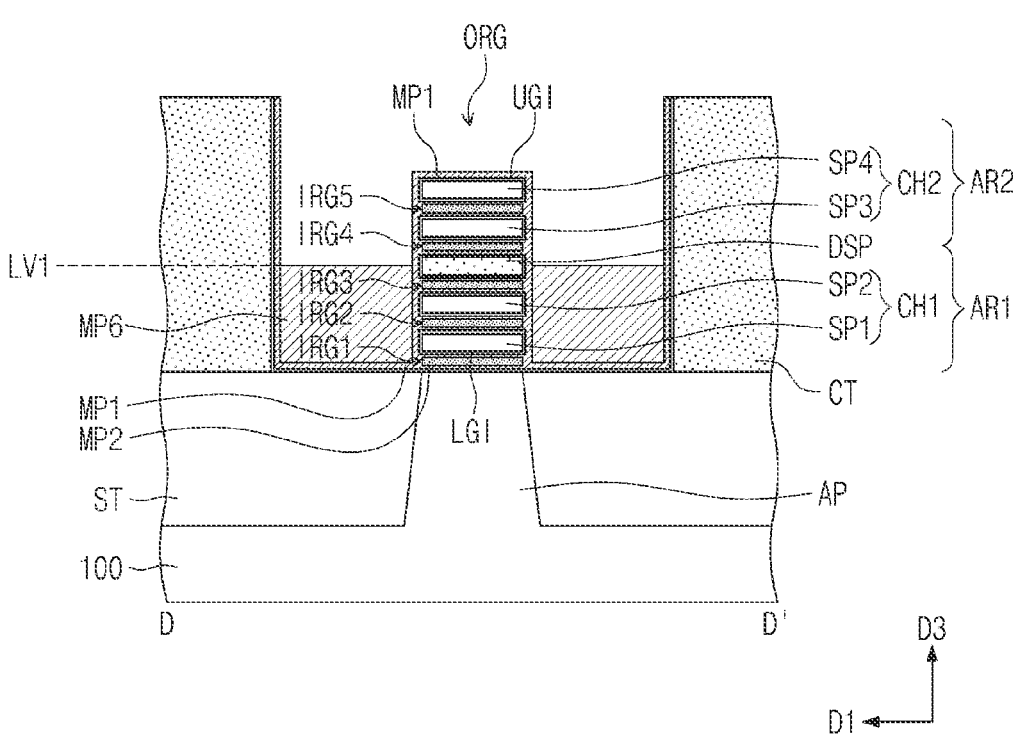

Referring to FIG. 22, a first work function metal layer may be deposited to conformally cover the first metal pattern MP1, and thus, the first metal pattern MP1 may have an increased thickness. The sixth metal pattern MP6 may be formed in a lower portion of the outer region ORG. In detail, the sixth metal pattern MP6 may be formed on the first and second metal patterns MP1 and MP2 to fill the outer region ORG. Next, the sixth metal pattern MP6 may be recessed to have a top surface located at a first level LV1. For example, the first level LV1 may be positioned between top and bottom surfaces of the dummy channel pattern DSP. The sixth metal pattern MP6 may be formed of or include at least one of low-resistance metals (e.g., tungsten (W), ruthenium (Ru), aluminum (Al), titanium (Ti), and tantalum (Ta)).

Figure 23:
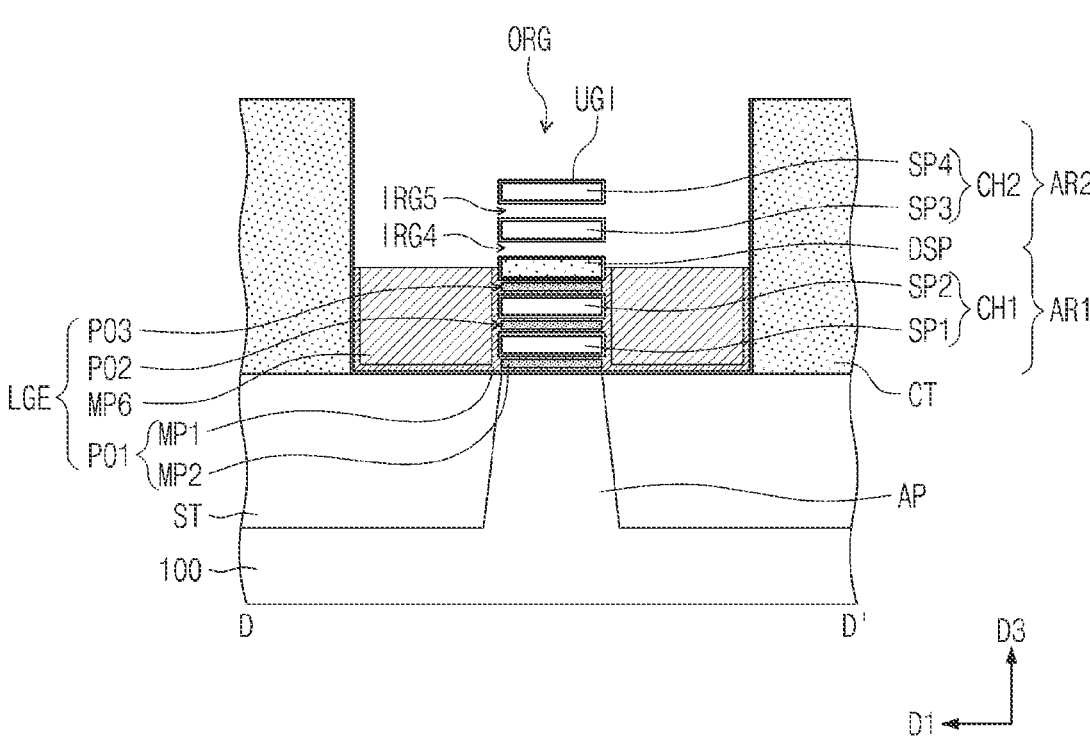

Referring to FIG. 23, an exposed portion of the first metal pattern MP1 may be selectively removed by an etching process using the sixth metal pattern MP6 as an etch mask. Since the second metal pattern MP2 is not removed, a portion of the first metal pattern MP1, which is located between the second metal pattern MP2 and the semiconductor pattern SP1 to SP4, may not be removed. Furthermore, the second metal pattern MP2, which is placed below the top surface of the sixth metal pattern MP6, may also be left as it is.

The first and second metal patterns MP1 and MP2, which are located below the top surface of the sixth metal pattern MP6, may be left to form the lower gate electrode LGE. The lower gate electrode LGE may include the first to third portions PO1, PO2, and PO3, which are respectively formed in the first to third inner regions IRG1, IRG2, and IRG3. Each of the first to third portions POL PO2, and PO3 may include the first metal pattern MP1 and the second metal pattern MP2. The lower gate electrode LGE may further include the sixth metal pattern MP6, which is formed in a lower portion of the outer region ORG.

Exposed portions of the first and second metal patterns MP1 and MP2 may be removed using the sixth metal pattern MP6 as an etch mask. Thus, the upper gate insulating layer UGI may be exposed to the outside.

Referring back to FIG. 17B, the third metal pattern MP3 may be formed on the upper gate insulating layer UGI. The third metal pattern MP3 may be formed to have a thickness that is large enough to fully fill the fourth and fifth inner regions IRG4 and IRG5. The third metal pattern MP3 may be the first work function metal and may be formed of or include a metal nitride layer which is the same as or different from the first metal pattern MP1.

The fourth metal pattern MP4 may be formed on the third metal pattern MP3 to partially fill the outer region ORG. The fourth metal pattern MP4 may be the second work function metal and may be formed of or include a metal carbide layer which is the same as or different from the second metal pattern MP2.

The fifth metal pattern MP5 may be formed on the fourth metal pattern MP4 to fill a remaining region of the outer region ORG. The fifth metal pattern MP5 may be formed of or include the first work function metal (e.g., titanium nitride) or a low resistance metallic material (e.g., tungsten).

The third to fifth metal patterns MP3 to MP5, which are formed on the lower gate electrode LGE, may constitute the upper gate electrode UGE. The upper gate electrode UGE may include the fourth and fifth portions PO4 and PO5, which are formed in the fourth and fifth inner regions IRG4 and IRG5, respectively. Each of the fourth and fifth portions PO4 and PO5 may include the third metal pattern MP3. The upper gate electrode UGE may further include the sixth portion PO6 formed in the outer region ORG. The sixth portion PO6 may include the third to fifth metal patterns MP3, MP4, and MP5, which are sequentially stacked.

Figure 24:
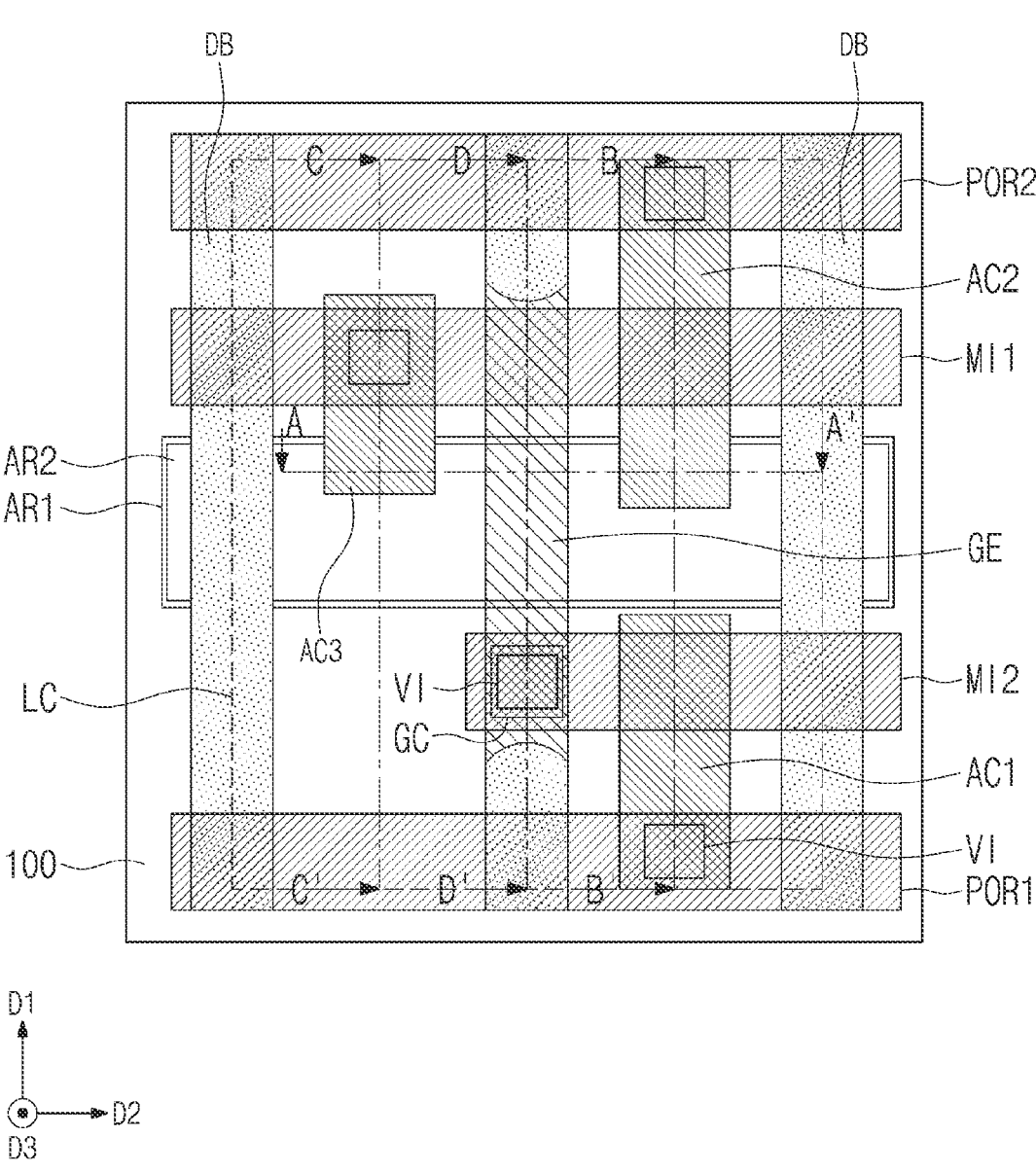
FIG. 24 is a plan view illustrating a three-dimensional semiconductor device according to an embodiment of the inventive concept.

FIG. 24 is a plan view illustrating a three-dimensional semiconductor device according to an embodiment of the inventive concept. FIGS. 25A to 25D are sectional views, which are respectively taken along lines A-A', B-B', C-C', and D-D' of FIG. 24. The three-dimensional semiconductor device illustrated in FIGS. 24 and 25A to 25D is provided as an example of the single height cell SHC of FIG. 2, and the inventive concept is not limited to this example. In the following description, an element previously described with reference to FIGS. 3 and 4A to 4D may be identified by the same reference number without repeating an overlapping description thereof, for the sake of brevity.

Referring to FIGS. 24 and 25A to 25D, the logic cell LC may be provided on the substrate 100. The logic cell LC according to the present embodiment may be an inverter cell. The logic cell LC may include the first and second active regions AR1 and AR2, which are sequentially stacked. In the present embodiment, the first active region AR1 may be an NMOSFET region, and the second active region AR2 may be a PMOSFET region.

The first active region AR1 may include the lower channel pattern CH1 and the lower source/drain patterns SD1, which are disposed at both sides of the lower channel pattern CH1. The second active region AR2 may include the upper channel pattern CH2 and the upper source/drain patterns SD2, which are disposed at both sides of the upper channel pattern CH2. At least one dummy channel pattern DSP may be interposed between the lower channel pattern CH1 and the upper channel pattern CH2 thereon.

The gate electrode GE may be provided on the lower and upper channel patterns CH1 and CH2, which are sequentially stacked. The gate electrode GE may include the lower gate electrode LGE, which is provided in the bottom tier (i.e., the first active region AR1) of the FEOL layer, and the upper gate electrode UGE, which is provided in the top tier (i.e., the second active region AR2) of the FEOL layer.

Figure 25A:
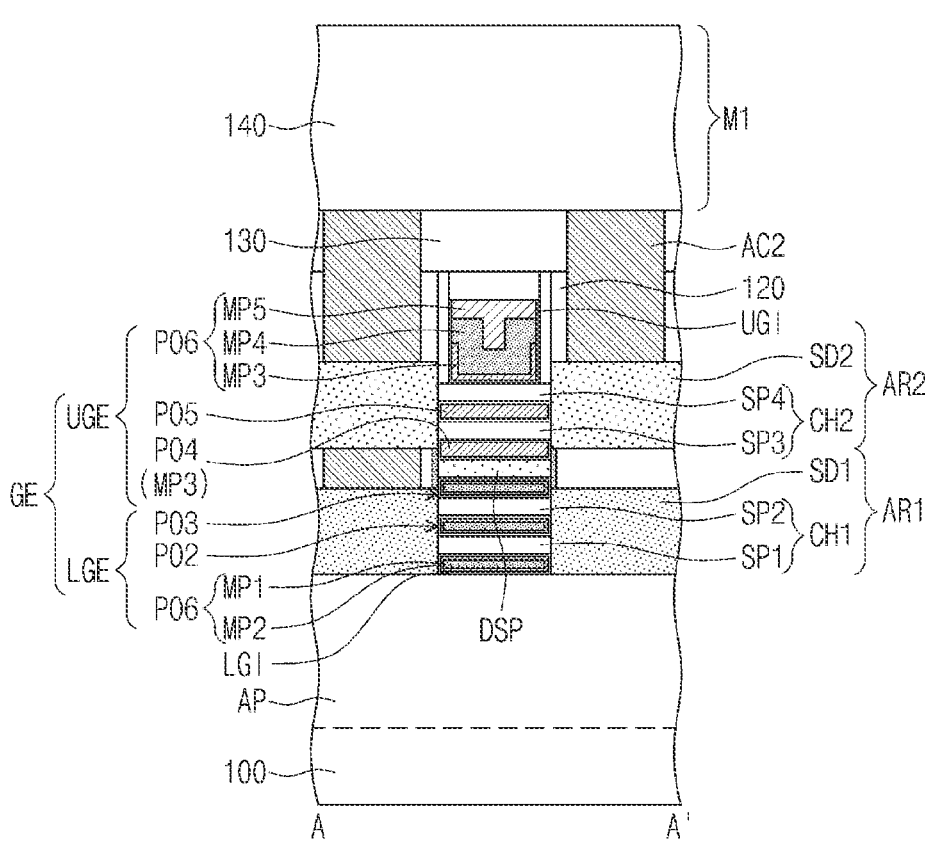
FIGS. 25A to 25D are sectional views, which are respectively taken along lines A-A', B-B', C-C', and D-D' of FIG. 24.
Figure 25A:
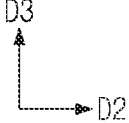
Figure 25B:
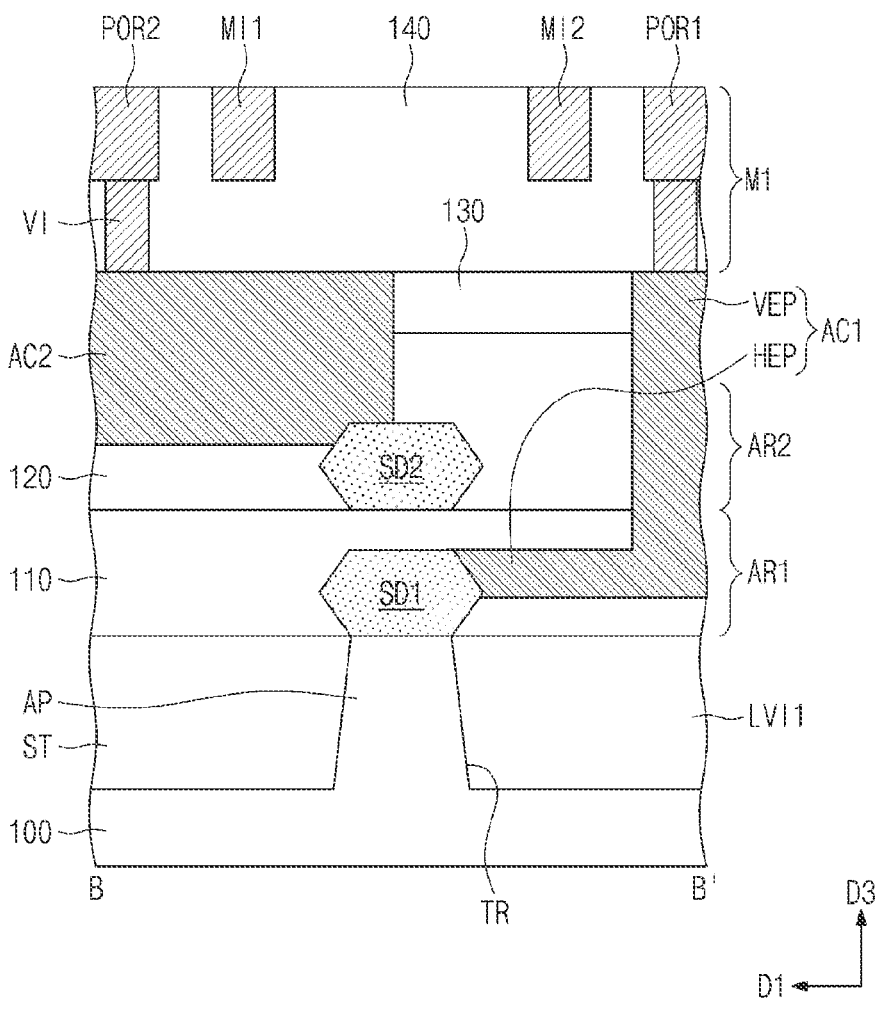
Figure 25C:
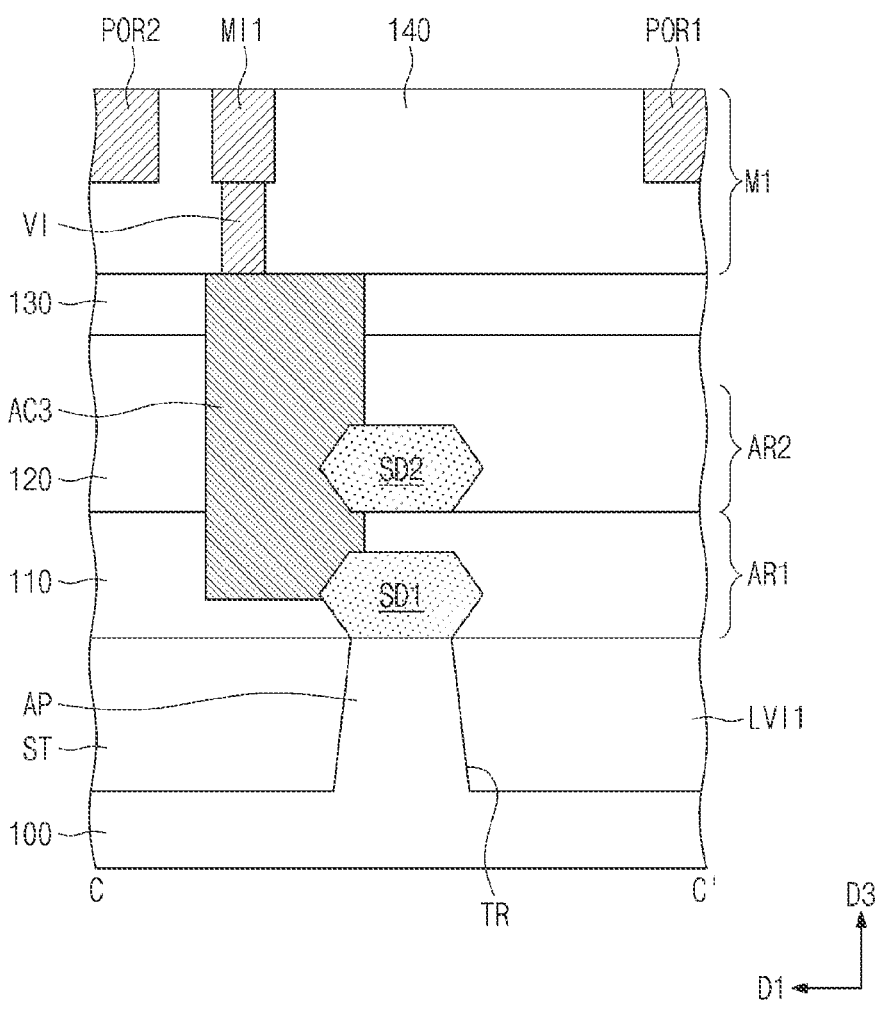
Figure 25D:
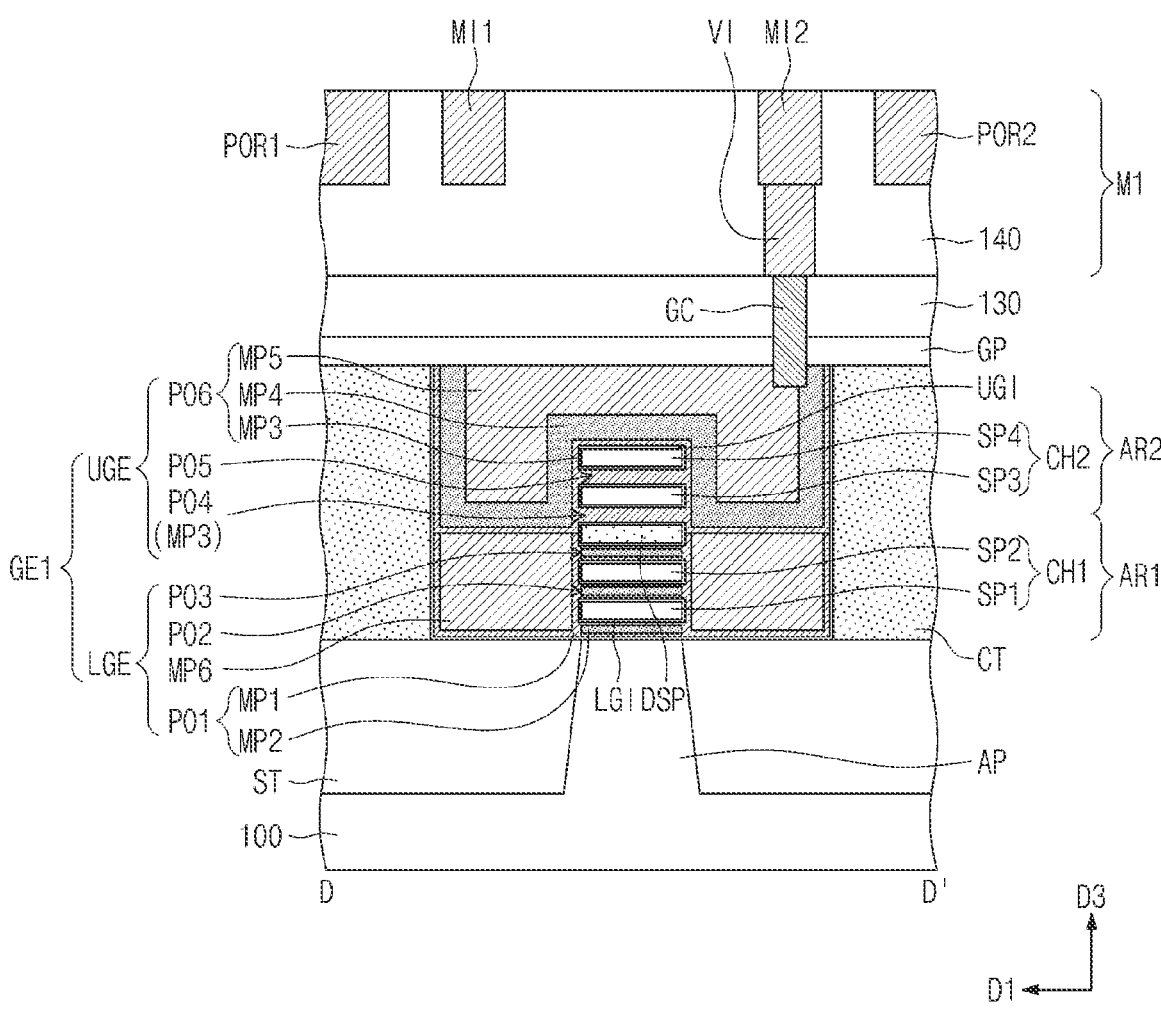

Referring to FIG. 25D, the gate contact GC, which is electrically connected to the gate electrode GE, may be provided. The gate contact GC may be disposed to be overlapped with the second interconnection line MI2 of the first metal layer M1.

Referring to FIG. 25B, the first active contact AC1 may be provided on the lower source/drain pattern SD1 adjacent to a first side of the gate electrode GE. The first active contact AC1 may include the vertical extended portion VEP and the horizontal extended portion HEP. The horizontal extended portion HEP may be extended in the first direction D1, and this may allow the vertical extended portion VEP to be overlapped with the first power line POR1.

The second active contact AC2 may be provided on the upper source/drain pattern SD2 adjacent to the first side of the gate electrode GE. The second active contact AC2 may be spaced apart from the first active contact AC1 in the first direction D1. A first portion of the second active contact AC2 may be overlapped with the upper source/drain pattern SD2. A second portion of the second active contact AC2 may be overlapped with the second power line POR2.

Referring to FIG. 25C, a third active contact AC3 may be provided on the lower and upper source/drain patterns SD1 and SD2, which are adjacent to a second side of the gate electrode GE opposite to the first side. The third active contact AC3 may be vertically extended to be in contact with both of the lower and upper source/drain patterns SD1 and SD2. In other words, the third active contact AC3 may be a common contact, which is connected in common to the lower and upper source/drain patterns SD1 and SD2. A first portion of the third active contact AC3 may be overlapped with the lower and upper source/drain patterns SD1 and SD2, and a second portion of the third active contact AC3 may be overlapped with the first interconnection line MI1 of the first metal layer M1.

The first metal layer M1 and the active and gate contacts GC and AC1 to AC3 may be connected to each other through the vias VI. For example, the first power line POR1 may be connected to the first active contact AC1 through the via VI, and the second power line POR2 may be connected to the second active contact AC2 through the via VI. The first interconnection line MI1 may be connected to the third active contact AC3 through the via VI. The second interconnection line MI2 may be connected to the gate contact GC through the via VI.

In a three-dimensional semiconductor device according to an embodiment of the inventive concept, a dummy channel pattern placed between a lower channel pattern and an upper channel pattern may be used to stably form a lower gate electrode and an upper gate electrode which are made of different materials. As a result, according to an embodiment of the inventive concept, it may be possible to realize a three-dimensional device, in which NMOS- and PMOS-FETs are vertically stacked, with high reliability.

While example embodiments of the inventive concept have been particularly shown and described, it will be understood by one of ordinary skill in the art that variations in form and detail may be made therein without departing from the scope of the present inventive concept.

What is claimed is:

1. A three-dimensional (3D) semiconductor device comprising:
   a first active region on a substrate, the first active region comprising a lower channel pattern and a pair of lower source/drain patterns on opposing side surfaces of the lower channel pattern, respectively;
   a second active region on the first active region, the second active region comprising an upper channel pattern and a pair of upper source/drain patterns on opposing side surfaces of the upper channel pattern, respectively;
   a dummy channel pattern between the lower channel pattern and the upper channel pattern;
   a pair of liner layers on opposing side surfaces of the dummy channel pattern, respectively; and
   a gate electrode on the lower channel pattern, the dummy channel pattern, and the upper channel pattern,
   wherein the gate electrode comprises a lower gate electrode on the lower channel pattern and an upper gate electrode on the upper channel pattern, and wherein each of the liner layers vertically overlaps with one of the lower source/drain patterns and one of the upper source/drain patterns.

2. The 3D semiconductor device of claim 1, wherein a top surface of the lower gate electrode is in contact with a bottom surface of the upper gate electrode, and
   the top surface of the lower gate electrode is at a level between a top surface and a bottom surface of the dummy channel pattern.

3. The 3D semiconductor device of claim 1, wherein the dummy channel pattern comprises a semiconductor material or an insulating material including silicon.

4. The 3D semiconductor device of claim 1, wherein the dummy channel pattern is spaced apart from the lower and upper source/drain patterns by the liner layers.

5. The 3D semiconductor device of claim 1, wherein the dummy channel pattern comprises a first dummy channel pattern and a second dummy channel pattern on the first dummy channel pattern, and
   the upper gate electrode comprises a portion between the first and second dummy channel patterns.

6. The 3D semiconductor device of claim 1, further comprising:
   a lower gate insulating layer between the lower channel pattern and the lower gate electrode; and
   an upper gate insulating layer between the upper channel pattern and the upper gate electrode,
   wherein the lower gate insulating layer includes a dipole element, and
   a concentration of the dipole element of the lower gate insulating layer is higher than a concentration of a dipole element of the upper gate insulating layer.

7. The 3D semiconductor device of claim 1,
   wherein the upper channel pattern comprises a first semiconductor pattern and a second semiconductor pattern on the first semiconductor pattern, the upper gate electrode comprises a first portion between the dummy channel pattern and the first semiconductor pattern and a second portion between the first semiconductor pattern and the second semiconductor pattern, and a thickness of the first portion in a vertical direction is thicker than a thickness of the second portion in the vertical direction.

8. The 3D semiconductor device of claim 7, wherein a thickness of the dummy channel pattern in the vertical direction is thicker than respective thicknesses of the first and second semiconductor patterns in the vertical direction.

9. The 3D semiconductor device of claim 1,
   wherein the lower channel pattern comprises a first semiconductor pattern and a second semiconductor pattern on the first semiconductor pattern, the upper channel pattern comprises a third semiconductor pattern and a fourth semiconductor pattern on the third semiconductor pattern, the lower gate electrode comprises a first portion between the first and second semiconductor patterns, the upper gate electrode comprises a second portion between the third and fourth semiconductor patterns, the first portion comprises a first metal pattern including a first work function metal and a second metal pattern including a second work function metal, the second portion comprises a third metal pattern including the first work function metal, and a thickness of the third metal pattern in a vertical direction is different from a thickness of the first metal pattern in the vertical direction.

10. The 3D semiconductor device of claim 9, wherein the second portion is devoid of the second work function metal.

* * * * *